US 8,245,102 B1
Aug. 14, 2012

(12) United States Patent
Cory et al.

(10) Patent No.: US 8,245,102 B1
(45) Date of Patent: Aug. 14, 2012

(54) ERROR CHECKING PARITY AND SYNDROME OF A BLOCK OF DATA WITH RELOCATED PARITY BITS

(75) Inventors: Warren E. Cory, Redwood City, CA (US); David P. Schultz, San Jose, CA (US); Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 1041 days.

(21) Appl. No.: 12/188,939

(22) Filed: Aug. 8, 2008

Related U.S. Application Data

(62) Division of application No. 10/971,220, filed on Oct. 22, 2004, now Pat. No. 7,426,678.

(60) Provisional application No. 60/589,887, filed on Jul. 20, 2004.

(51) Int. Cl.
*G06F 11/00* (2006.01)
(52) U.S. Cl. ........................................ 714/753
(58) Field of Classification Search ................. None
See application file for complete search history.

(56) References Cited

U.S. PATENT DOCUMENTS

| | | | | |
|---|---|---|---|---|
| 4,597,083 A | * | 6/1986 | Stenerson | 714/753 |
| 4,692,922 A | | 9/1987 | Kiriu et al. | |
| 4,866,604 A | * | 9/1989 | Reid | 713/600 |
| 5,331,645 A | | 7/1994 | Miller et al. | |
| 5,361,266 A | * | 11/1994 | Kodama et al. | 714/758 |
| 5,469,003 A | * | 11/1995 | Kean | 326/39 |
| 5,555,250 A | * | 9/1996 | Walker et al. | 714/763 |
| 5,691,996 A | * | 11/1997 | Chen et al. | 714/805 |
| 5,768,294 A | * | 6/1998 | Chen et al. | 714/766 |
| 5,996,105 A | * | 11/1999 | Zook | 714/755 |
| 6,041,431 A | | 3/2000 | Goldstein | |
| 6,192,499 B1 | * | 2/2001 | Yang | 714/785 |
| 6,242,945 B1 | | 6/2001 | New | |
| 6,606,727 B1 | | 8/2003 | Yang et al. | |
| 6,615,387 B1 | * | 9/2003 | Williamson et al. | 714/785 |
| 6,745,363 B2 | * | 6/2004 | Poirier et al. | 714/763 |
| 6,822,894 B1 | | 11/2004 | Costello et al. | |
| 6,877,126 B2 | * | 4/2005 | Hall et al. | 714/769 |
| 6,907,559 B2 | | 6/2005 | Hall et al. | |
| 6,920,627 B2 | | 7/2005 | Blodget et al. | |
| 6,982,451 B1 | | 1/2006 | Voogel et al. | |

(Continued)

OTHER PUBLICATIONS

Microsoft Computer Dictionary, Microsoft Press, 4th Ed. 1999, p. 332.*

(Continued)

*Primary Examiner* — Christopher McCarthy
(74) *Attorney, Agent, or Firm* — W. Eric Webostad; Gerald Chan

(57) ABSTRACT

Method and apparatus for error checking information is described. Configuration data includes data bits and parity bits. Notably, parity bits may be relocated for determining a syndrome value. Syndrome bits are determined by computing a partial syndrome value for each word serially transmitted of the configuration data, where the configuration data includes one or more data vectors. Location of each word of the configuration data is identified. It is determined whether a partial syndrome value is an initial partial syndrome value or other partial syndrome value responsive to word location. An initial partial syndrome value is stored, and subsequent partial syndrome values are cumulatively added for each word of a data vector to arrive at a syndrome value for the data vector.

18 Claims, 18 Drawing Sheets

U.S. PATENT DOCUMENTS

| | | | |
|---|---|---|---|
| 7,028,150 B2 * | 4/2006 | McAllister et al. | 711/156 |
| 7,036,059 B1 | 4/2006 | Carmichael et al. | |
| 7,102,555 B2 | 9/2006 | Collins et al. | |
| 7,109,746 B1 | 9/2006 | Voogel et al. | |
| 7,132,851 B2 | 11/2006 | Young | |
| 7,139,190 B1 | 11/2006 | De Jong | |
| 7,143,329 B1 * | 11/2006 | Trimberger et al. | 714/746 |
| 7,187,200 B2 | 3/2007 | Young | |
| 7,212,448 B1 | 5/2007 | Trimberger | |
| 7,218,137 B2 | 5/2007 | Vadi et al. | |
| 7,228,490 B2 * | 6/2007 | Ball et al. | 714/785 |
| 7,236,000 B1 | 6/2007 | Steiner | |
| 7,254,800 B1 * | 8/2007 | Trimberger | 716/117 |
| 7,263,631 B2 | 8/2007 | VanBuren | |
| 7,283,409 B1 | 10/2007 | Voogel et al. | |
| 7,288,957 B2 * | 10/2007 | Plants | 326/9 |
| 7,328,377 B1 * | 2/2008 | Lewis et al. | 714/48 |
| 7,334,159 B1 * | 2/2008 | Callaghan | 714/30 |
| 7,426,678 B1 * | 9/2008 | Cory et al. | 714/785 |
| 7,443,191 B2 * | 10/2008 | Plants | 326/9 |
| 7,484,161 B2 * | 1/2009 | Dell et al. | 714/758 |
| 7,847,589 B2 * | 12/2010 | Kyouno et al. | 326/41 |
| 7,895,509 B1 * | 2/2011 | Cory et al. | 714/801 |
| 7,979,826 B1 * | 7/2011 | Trimberger | 716/117 |
| 2004/0124876 A1 * | 7/2004 | Plants | 326/39 |
| 2006/0085720 A1 * | 4/2006 | Tran et al. | 714/758 |
| 2007/0300129 A1 * | 12/2007 | Dell et al. | 714/764 |

OTHER PUBLICATIONS

Barg, Alexander et al., "On the Complexity of Minimum Distance Decoding of Long Linear Codes," *IEEE*, Jul. 5, 1999, pp. 1392-1405, vol. 45, No. 5.

Johansson, Thomas et al., "A Simple One-Sweep Algorithm for Optimal ASP Symbol Decoding of Linear Block Codes," *IEEE* Nov. 7, 1998, pp. 3124-3129, vol. 44, No. 7.

Wakerly, John F., "Digital Design Principles and Practice," Sec. 1.15.3—Codes for Detecting and Correcting Errors, Hamming Codes, copyright 1990, pp. 39-41, Prentice-Hall, Inc., Englewood Cliffs, New Jersey.

Xilinx, Inc., "Single Error Correction and Double Error Detection (SECDED) with CoolRunner-II CPLDs," Application Note XAPP 383 (v1.1), Aug. 1, 2003, pp. 1-4, available from Xilinx, Inc., 2100 Logic Drive, San Jose, California, 95124.

Xilinx, Inc., "Virtex-II Pro Platform FPGA Handbook," UG012 (v2. 0), Oct. 14, 2002, pp. 19-71, available from Xilinx, Inc., 2100 Logic Drive, San Jose, California, 95124, US.

U.S. Appl. No. 10/971,220, filed Oct. 22, 2004, Cory et al.

U.S. Appl. No. 12/188,935, filed Aug. 8, 2008, Cory et al.

* cited by examiner

ERROR CHECKING PARITY AND SYNDROME OF A BLOCK OF DATA WITH RELOCATED PARITY BITS

FIELD OF THE INVENTION

One or more aspects of the invention relate generally to error detection and correction.

BACKGROUND OF THE INVENTION

Single error correction-double error detection ("SECDED") decoding may be used for decoding a string of bits, where error checking ("parity") bits have been added to a set of data bits. SECDED codes for encoding information are also well known as "distance-4 Hamming codes." A parity bit is any bit associated with one or more data bits for error checking a transmission of such data bits. Conventionally, parity bits are transmitted with data bits. "Error checking" may include both error detection and correction, or error detection without error correction.

For SECDED decoding, if any one bit, including data and parity bits, of a transmission is in error, the error can be detected and corrected; and if any two bits, including data bits, parity bits, or any combination of data and parity bits, of a transmission are in error, the error can be detected although it cannot be corrected.

With respect to configuring a programmable logic device, such as a Field Programmable Gate Array ("FPGA"), a configuration bitstream is transmitted to the FPGA. For configuring an FPGA, a bitstream frame of such a configuration bitstream may be in excess of a thousand bits, where bits are transmitted one word at a time. In other words, each bitstream frame is read one word at a time and not as a single thousand or more bit vector.

Accordingly, it would be both desirable and useful to provide error checking for bitstream frames transmitted one word at a time.

SUMMARY OF THE INVENTION

An aspect of the invention is a method for decoding encoded information, where the encoded information includes data bits and parity bits. The method includes: obtaining a portion of the encoded information via a transmission; computing a partial syndrome value for the portion of the encoded information; identifying location of the portion of the encoded information relative to other portions of the encoded information; determining whether the partial syndrome value is an initial partial syndrome value or other partial syndrome value responsive to the location; storing the partial syndrome value as a syndrome value responsive to the partial syndrome value being an initial partial syndrome value; and combining the partial syndrome value with the syndrome value previously stored responsive to the partial syndrome value not being an initial partial syndrome value for storage as the syndrome value anew.

Another aspect of the invention is a decoder. Syndrome logic is coupled to receive a plurality of words of a data vector one word at a time and configured to compute a partial syndrome for each word where, typically, the currently computed partial syndrome is being combined with the previously stored partial syndrome. Storage devices are coupled to the syndrome logic to store the partial syndromes computed responsive to a clock signal. A feedback filter is coupled to receive the partial syndromes stored and to provide the partial syndromes stored to the syndrome logic. A controller is coupled to the feedback filter and to the syndrome logic. The controller has a counter configured to count responsive to the clock signal to provide a count indicative of a word number of the word. The controller is configured to provide an initial word control signal and a parity word control signal, count beginning at an initial word number and ending with a last word number for the data vector, and increment a count and to skip a reserved word number. The feedback filter is coupled to receive the initial word control signal and configured to preclude providing the partial syndromes stored to the syndrome logic responsive to the initial word control signal. The syndrome logic is coupled to receive the parity word control signal for computation of the partial syndromes and coupled to receive and combine the partial syndromes of the data vector.

An aspect of the invention is an apparatus for error checking including a matrix having a plurality of bit position columns and rows. The bit position columns are equal in number to data bits of a word length, where the word length is for a word serial transmission of a data vector, and where the bit position columns are one each for each data bit. The bit position rows are equal in number to syndrome bits, where the bit position rows are one each for each syndrome bit. A portion of the bit position columns are allocated to parity bits for a selected word of the data vector, where the portion of the bit position columns for the selected word is one each for each parity bit allocated to the selected word.

Another aspect of the invention is a method for error correcting configuration data written to configuration memory of a programmable logic device, the method including: reading a portion of the configuration data written to the configuration memory, the configuration data including error correction bits; computing a partial syndrome value for the portion of the configuration data; identifying location of the portion of the configuration data relative to other portions of the configuration data; determining whether the partial syndrome value is an initial partial syndrome value or other partial syndrome value responsive to the location; storing the partial syndrome value as a syndrome value responsive to the partial syndrome value being an initial partial syndrome value; and combining the partial syndrome value with the syndrome value previously stored responsive to the partial syndrome value not being an initial partial syndrome value for storage as the syndrome value anew.

Yet another aspect of the invention is a programmable logic device having configuration memory, including: a memory interface coupled to the configuration memory; an error checker coupled to the configuration memory, the error checker coupled to receive configuration information read from the configuration memory via the memory interface, the configuration information including error correction bits, the error checker configured to determine partial syndrome values from subframes of the configuration information read; an error detector coupled to the error checker to receive the syndrome value determined and to provide an error signal to indicate whether an error was detected; and a controller coupled to the memory interface to control reading out of the configuration information from the configuration memory, the controller coupled to the error detector to receive the error signal.

Yet another aspect of the invention is a programmable logic device, including: a configuration interface; an error checker coupled to the configuration interface, the error checker coupled to receive configuration information provided via the configuration interface, the configuration information including error correction bits, the error checker configured to determine partial syndrome values from subframes of the configuration information read; and an error detector coupled to the error checker to receive the syndrome value determined and to provide an error signal to indicate whether an error was detected.

Still yet another aspect of the invention is a method for decoding encoded information, the encoded information including data bits and parity bits, the method including: obtaining a portion of the encoded information; relocating at least one parity bit of the parity bits within the portion of the encoded information; and computing a partial syndrome value for the portion of the encoded information with the at least one parity bit relocated.

Another embodiment of the present invention includes an integrated circuit having programmable logic and programmable interconnections; a bitstream having sets of bits, where each set of bits, e.g., a frame, has a data portion and an error correction code portion, and where the bitstream is for programming the programmable logic and programmable interconnections; configuration memory cells configured to store the sets of bits; and dedicated hardwired error correction code logic for correcting at least one bit in the data portion of each set of bits using the error correction code portion.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 2 is a matrix diagram depicting an exemplary embodiment of bit positions matrix.

FIG. 3 is a matrix diagram depicting an exemplary embodiment of the bit positions matrix of FIG. 2 for N equal to 22.

FIG. 5 is a listing of equations for calculating a syndrome value in response to a word input.

FIG. 8 is a matrix diagram depicting an exemplary embodiment of bit positions matrix for an extra bit in a counter and having a complement of N.

FIG. 9 is a matrix diagram depicting an exemplary embodiment of the bit positions matrix of FIG. 8 for N equal to binary 1001101.

To facilitate understanding, identical reference numerals have been used, where possible, to designate identical elements that are common to the figures.

DETAILED DESCRIPTION

Figure 1:
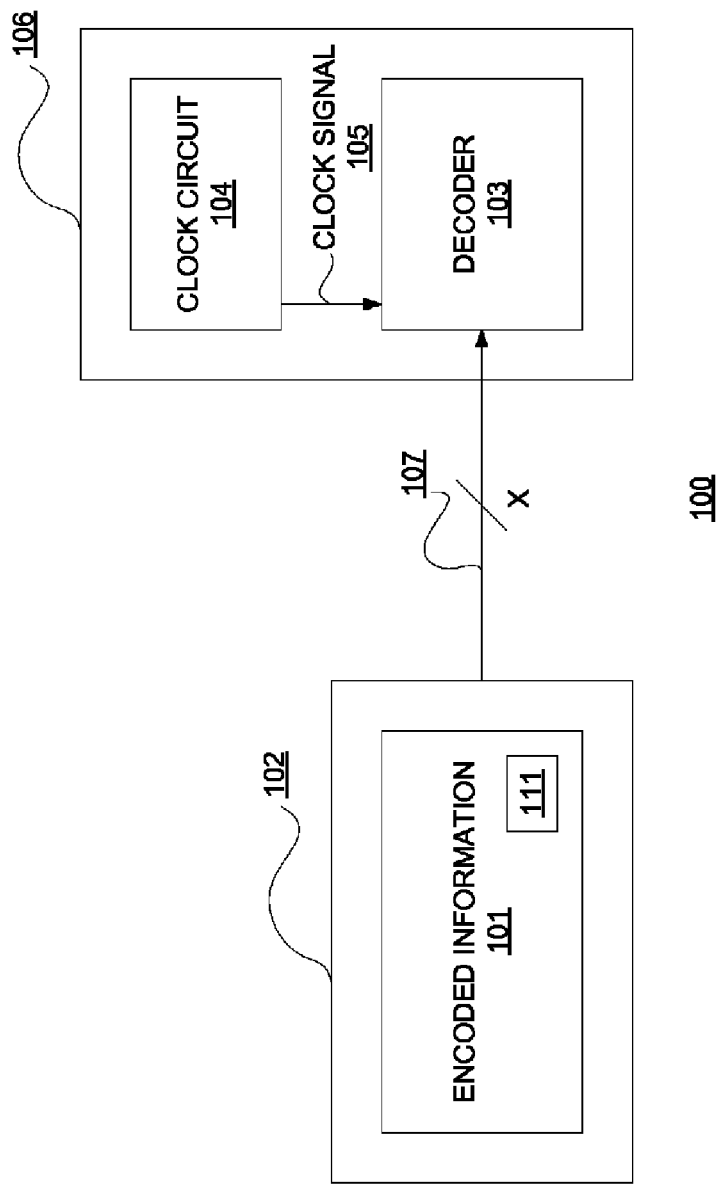
FIG. 1 is a block diagram depicting an exemplary embodiment of a transmission system.

FIG. 1 is a block diagram depicting an exemplary embodiment of a transmission system 100. Source device 102 includes encoded information 101 having data and parity bits. Source device 102 may be any of a variety of known devices capable of transmitting information, including, but not limited to, an integrated circuit (e.g., memory), a transmitter, or a computational device configured to encode data bits with parity bits, among other known devices for transmitting information.

Encoded information 101 is sent to destination device 106 via communication conduit 107. Destination device 106 may be any of a variety of known devices capable of receiving information, including, but not limited to, an integrated circuit (e.g., an FPGA), a receiver, or a computational device configured to decode, among other known devices for receiving information. Communication conduit 107 may be any of a variety of known interconnects capable of communicating information, including, but not limited to, optical fiber, circuit board traces, or antenna for over-the-air communication, among other known communication conduits. Furthermore, information may be transmitted via communication conduit 107 in data packets.

For purposes of clarity, and not limitation, communication conduit 107 is described in terms of a X-bit wide data interface, for X an integer. In the particular implementation described herein, X is equal to 32, as word length is 32 bits long. However, other values for X may be used for a word length. Examples of word lengths, other than 32 bits, are 8-, 16-, and 64-bit words, among others which may be used. Moreover, a one-bit wide serial implementation may be used.

Encoded information 101 is transmitted one word at a time ("word-serial transmission"). Encoded information 101 may include one or more Y-bit vectors, for Y an integer greater than X. Conventionally, Y will be hundreds or thousands of bits in length. It should be understood that encoded information 101 may be word-serially transmitted for all bits in a data vector. Encoded information 101 alternatively may be transmitted one-bit serially, and then converted from such a serial form to a parallel form of input to decoder 103. Furthermore, alternatively, encoded information 101 may be transmitted and input one-bit serially to decoder 103.

Encoded information 101 is provided one word at a time to decoder 103. Decoder 103 decodes encoded information 101 responsive to a clock signal 105 from clock circuit 104. Notably, in an implementation described herein, decoder 103 decodes encoded information 101 continuously between received bitstream frames. However, decoder 103 may decode encoded information 101 discontinuously between received bitstream frames, for example by being periodically reset after each bitstream frame. Though, it should be appreciated by decoding continuously, a clock cycle of clock signal 105 spent for each reset of decoder 103 may be avoided.

Figure 2:
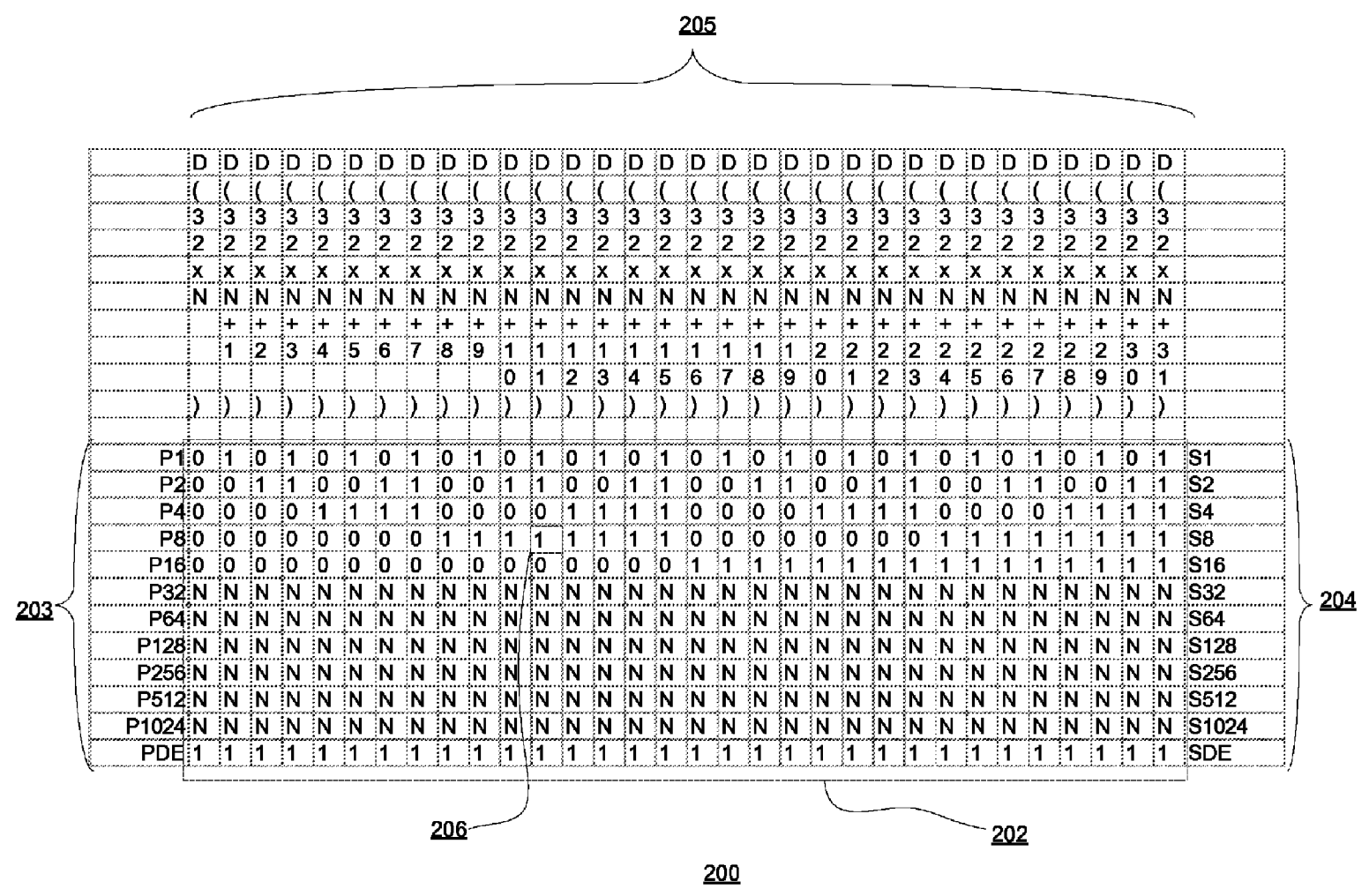

FIG. 2 is a matrix diagram depicting an exemplary embodiment of bit positions matrix 200. Column labels 205, e.g., D(32×N) to D(32×N+31), identify the data bits in a single 32-bit word of encoded information 101. Matrix entries in box 202, e.g., 206, describe the computation of parity bits 203 and syndrome bits 204. Parity bits 203 are encoded for transmission with data bits (column labels 205). Syndrome bits 204 are computed as described below in additional detail from transmitted data and parity bits.

SECDED does not require that bit numbers, parity or data, be assigned sequentially or consecutively. Thus, for example, numbers may be skipped and be out of a strictly ascending or descending order. However, for purposes of clarity, data bits (column labels 205) have been placed in a sequentially ascending and consecutive order, and parity bits 203 have been placed in a sequential and descending order. For purposes of clarity by way of example, 1312 bits are used for a bitstream frame 111 of encoded information 101 of FIG. 1. Of these 1312 bits, 1300 bits are data bits, e.g., column labels 205 showing a 32 bit group, and 12 bits (P1, P2, P4, P8, P16, P32, P64, P128, P256, P512, P1024 and parity double error ("PDE") (shown in FIG. 4)) are parity bits 203. Notably, 12 parity bits, including PDE for double error detection, are sufficient to implement SECDED decoding for up to 2036 data bits. Forty-one (41) iterations of reading 32 bits at a time are used for a 1312 bit vector.

With continuing reference to FIG. 2 and renewed reference to FIG. 1, decoding of bits is further described. Parity bits 203 are to be located in bitstream frame 111 by decoder 103. Thus, parity bits 203 may occupy a predetermined location within each bitstream frame 111. Furthermore, system design requirements may dictate that all parity bits 203 should be located within the same 32-bit word. For example, all 12 parity bits 203 may be contiguously located within the twenty-first 32-bit word of a 1312-bit vector. Of course, all parity bits do not have to be located within a single word, and other words, other than the middle word of a frame transmission, may be used to carry parity bits.

A set of bit numbers amenable to computation of a 32-bit syndrome is selected. In the example of a 1312-bit vector where twelve bits are parity bits, the ability to handle 2036 data bits (2048 total bits) allows bit positions to be shifted. For example, bit numbers for a 1312-bit frame may be, from beginning to end: D704 to D1023, D1056 to D1395, PDE, P1, P2, P4, P8, P16, P32, P64, P128, P256, P512, P1024, and D1408 to D2047, where "D" denotes a data bit and a subsequent number denotes a numerical bit position. Powers of two are bit numbers reserved for parity bits, where "P" denotes a parity bit and a subsequent number denotes a numerical bit position. Notably, parity bit PDE may be referred to as "P2048," meaning it is located at bit number 2048. It should be understood that bit numbers do not necessitate order of transmission of bits. Thus, for example, parity bits 203 may be transmitted between data bits D1395 and D1408.

Using larger bit numbers, as opposed to smaller bit numbers, is convenient because of the relative ease of avoiding powers of two for sequences of data bits, which bit numbers are reserved for parity bits. Thus, in the above example, there is only one power of two in the range from 704 to 2047, namely, 1024, which is skipped. In other words, data bit numbers skip from 1023 to 1056, namely, from 1024 for one 32-bit word length.

As in FIG. 2, bit numbers may be expressed in 32-bit groups. For N an integer from 22 to 31, the range of data bits is D(32×N) to D(32×N+31). N equal to 32 is skipped for data bits, as 32 times 32 equals 1024 which is a power of two and reserved for a parity bit. For N an integer from 33 to 42, the range of data bits is D(32×N) to D(32×N+31). For N equal to 43 (shown in FIG. 4), the range of data bits is D(32×N) to D(32×N+19) and parity bits PDE, P1, P2, P4, P8, P16, P32, P64, P128, P256, P512 and P1024 take up the remaining 12-bits of this word. For N an integer from 44 to 63, the range of data bits is D(32×N) to D(32×N+31). Thus, matrix 200 of FIG. 2 covers N equal to values from 22 to 63, except for N equal to 32, where N equal to 43 is handled differently than other values of N. Thus, there are 41 iterations for transmitting 32-bit words to transmit a 1312-bit vector.

In the example, syndrome bits 204, denoted by a lead "S" followed by a number, are bits S1, S2, S4, S8, S16, S32, S64, S128, S256, S512 and S1024. In the example, bits S1, S2, S4, S8 and S16 of syndrome bits 204 have values 0 or 1 for each data bit. For example, for data bit D(32×N+19), a binary value of 11001 is respectively associated with values for bits S1, S2, S4, S8 and S16 of syndrome bits 204. Accordingly, these bit values for bits S1, S2, S4, S8 and S16 are the same for each 32-bit word processed, except for the parity bits in the word with N equal to 43.

While coding for decoder 103 may be hard or soft coded, or a combination thereof, where hard coding includes use of programmable logic, dedicated logic or a combination thereof, it should be appreciated that because S1, S2, S4, S8 and S16 are not dependent on N for their respective values, they may be hard coded resulting in performance advantages.

Bits S32, S64, S128, S256, S512 and S1024 of syndrome bits 204 are dependent upon the binary value of N, as denoted in matrix 200 by entries "N" for bits S32, S64, S128, S256, S512 and S1024 of syndrome bits 204.

Figure 3:
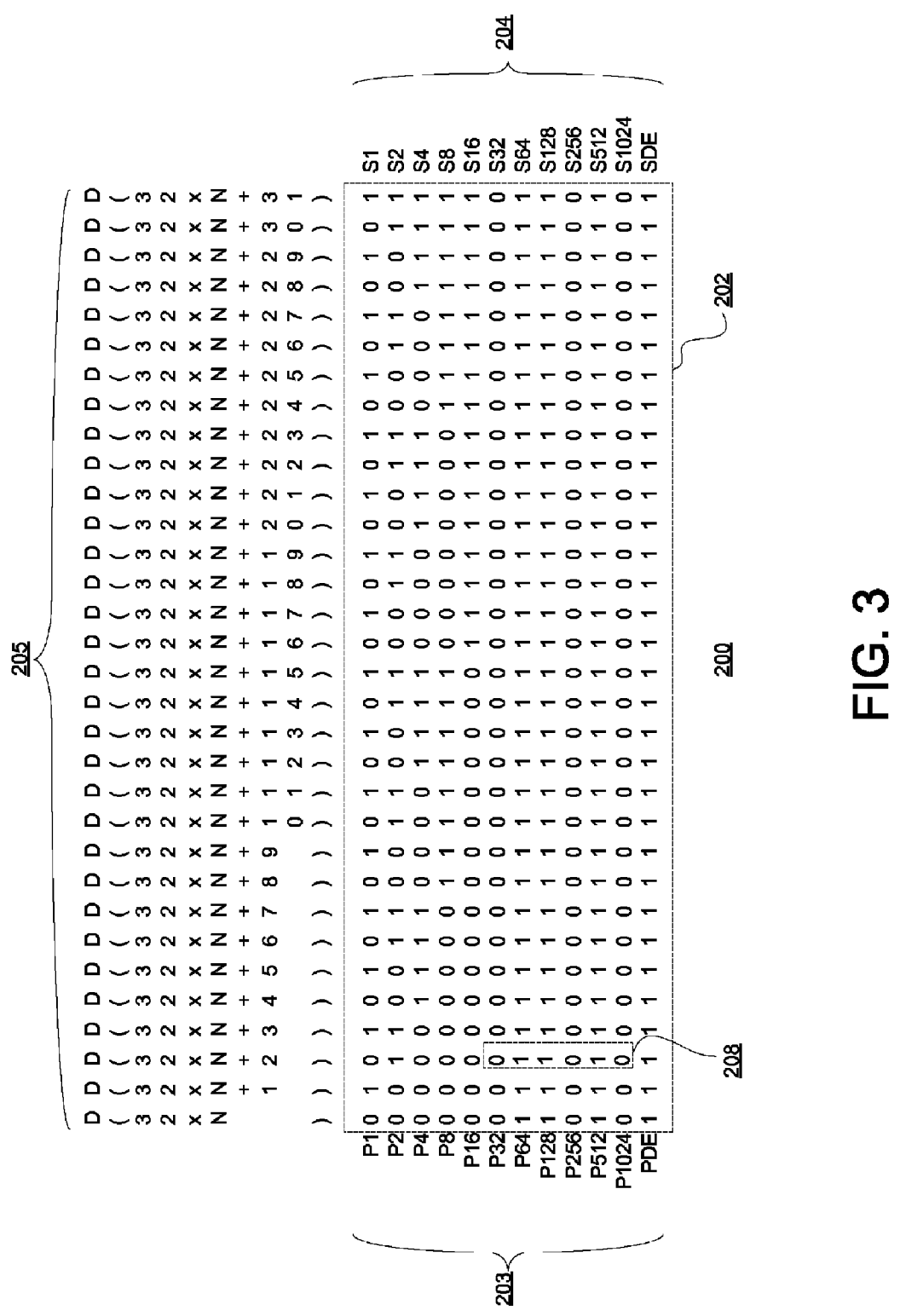

FIG. 3 is a matrix diagram depicting an exemplary embodiment of bit positions matrix 200 of FIG. 2 for N equal to 22. For N equal to 22, syndrome bits S32, S256 and S1024 are all binary zeros. This indicates that none of syndrome bits S32, S256 and S1024 are operated on by a Boolean exclusive OR function into a syndrome bit. In other words, syndrome bits S32, S256 and S1024 are not modified for all bits of a 32-bit word for N equal to 22. For N equal to 22, syndrome bits S64, S128 and S512 are all binary ones. This indicates that all of syndrome bits S64, S128 and S512 are operated on by a Boolean exclusive OR function into a syndrome bit.

Figure 4A:
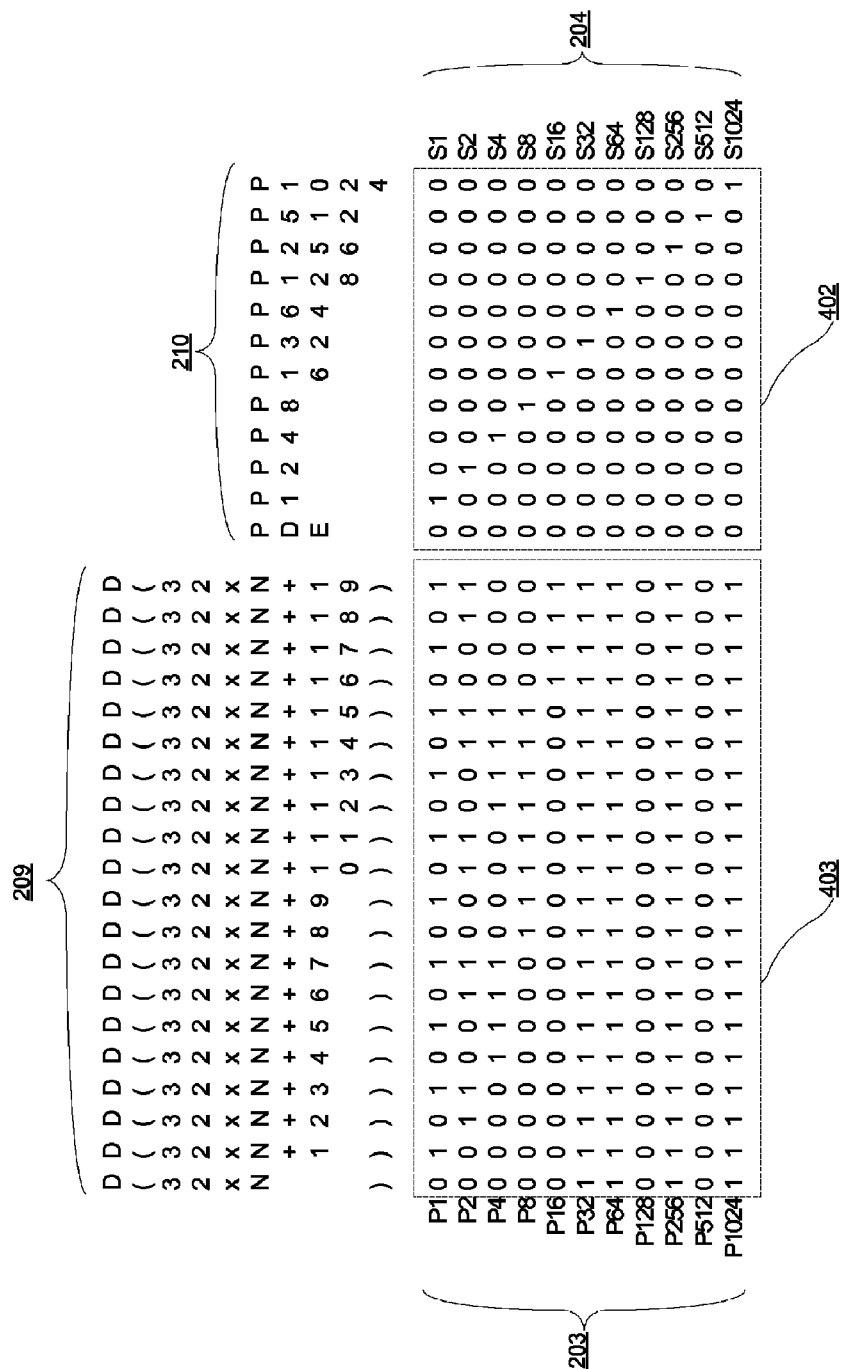
FIG. 4A is a matrix diagram depicting an exemplary embodiment of bit positions matrix for N equal to 43.

FIG. 4A is a matrix diagram depicting an exemplary embodiment of bit positions matrix 400 for N equal to 43. Bit positions matrix 400 is similar to bit positions matrix 200 of FIG. 2, except that for N equal to 43 both data bits and parity bits appear in a 32-bit word transmitted and received. Bit positions 403 are for data bits. Bit positions 402 are for parity bits. Thus, the first twenty columns 209 of bit position matrix 400 are for data bits and handled as previously described with respect to bit positions matrix 200 of FIG. 2, and the last twelve columns 210 are for parity bits and handled differently than the first twenty columns, as described below in additional detail. Notably, a PDE bit does not contribute to any syndrome bit 204, as the PDE column is all binary zeros. However, the PDE bit does contribute to a syndrome double error ("SDE") bit, as described below in additional detail. An SDE syndrome bit row may be denoted as "S2048" with a binary one in each bit position.

Figure 4B:
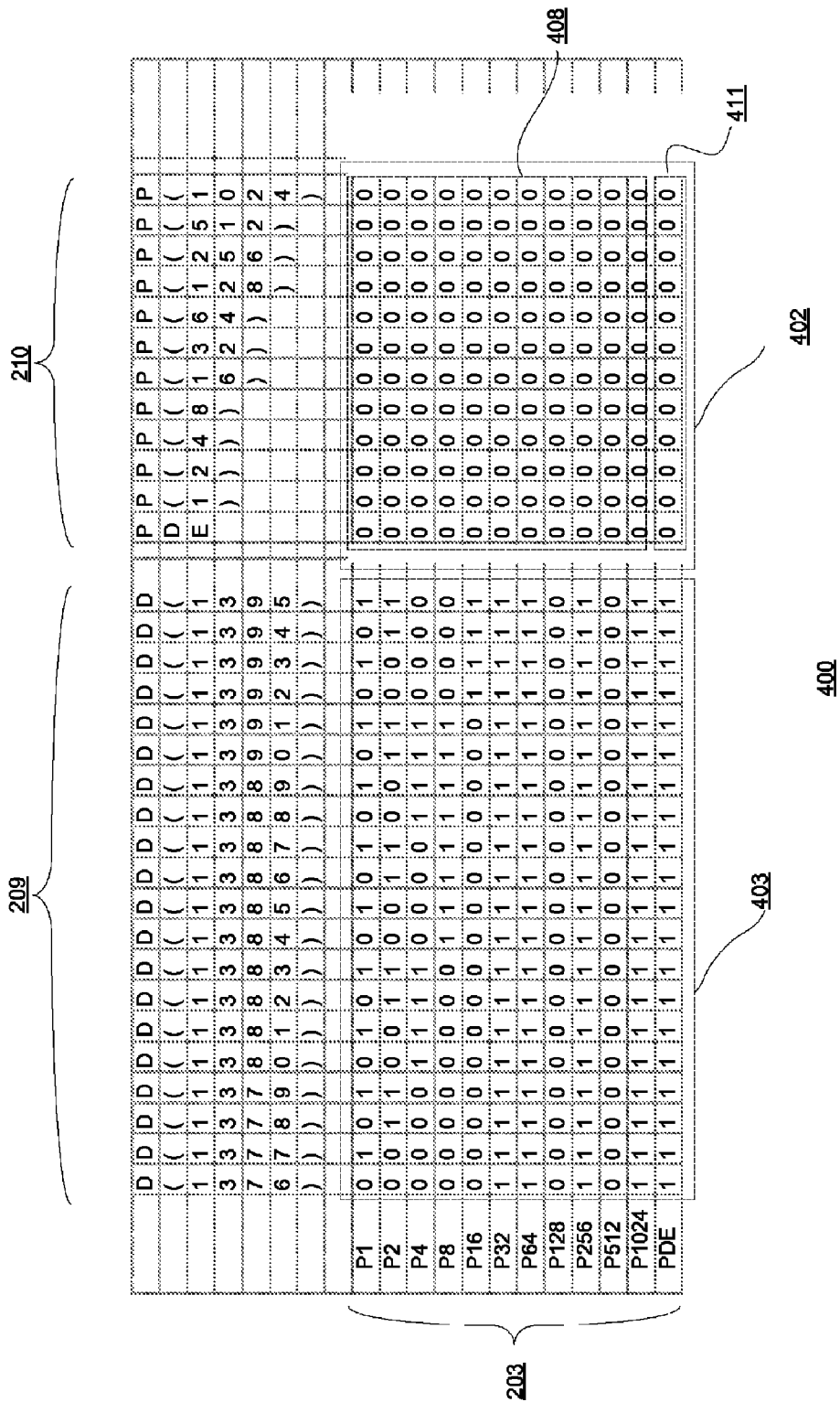
FIGS. 4B and 4C are matrix diagrams depicting exemplary embodiments of the parity and syndrome bits of the matrix diagram of FIG. 4A.
Figure 4C:
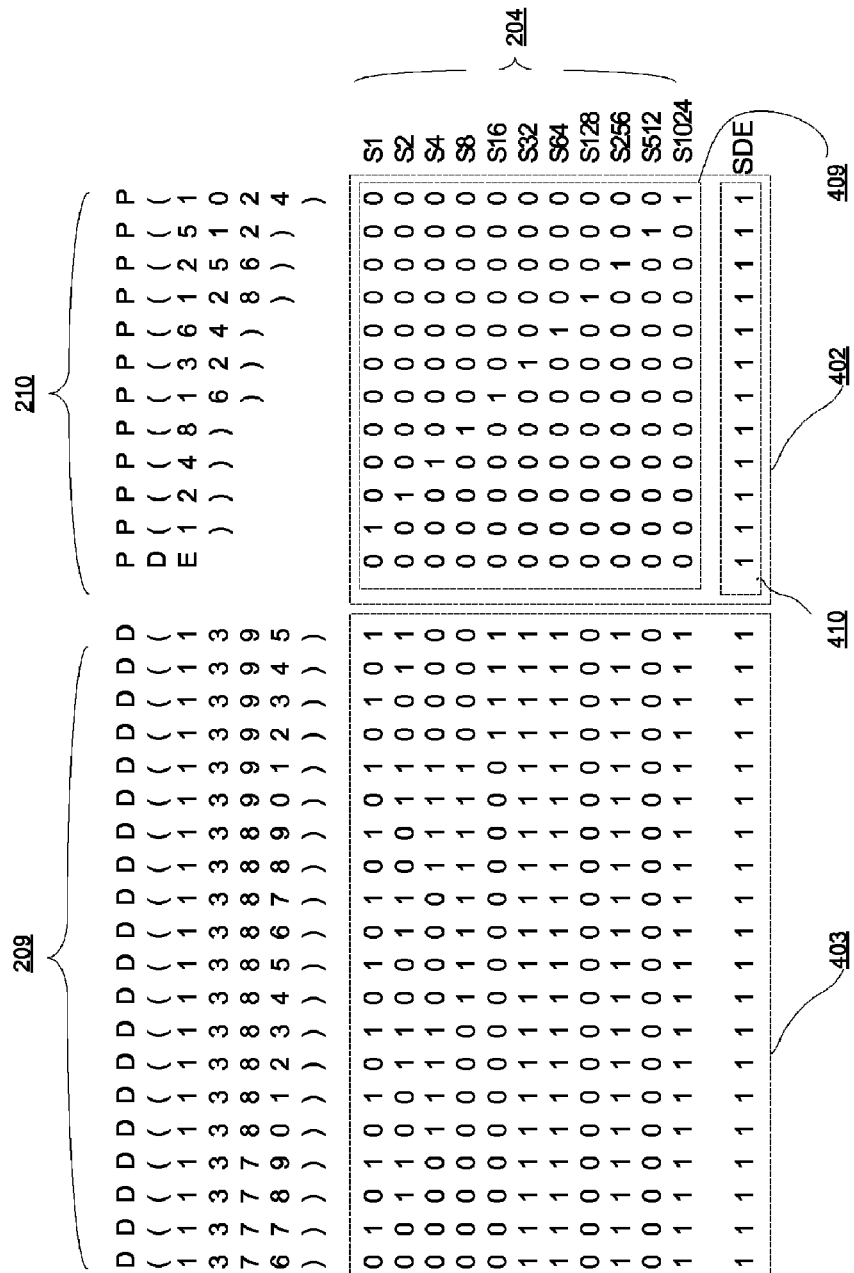

FIGS. 4B and 4C are matrix diagrams depicting exemplary embodiments of the parity and syndrome bits of the matrix diagram of FIG. 4A. SECDED syndrome bits SDE S(1024), S(512), S(256), S(128), S(64), S(32), S(16), S(8), S(4), S(2), and S(1) are calculated for a data block having 1300 data bits and 12 parity bits, processing 32 bits of such a data block at a time. SECDED parity bits PDE P(1024), P(512), P(256), P(128), P(64), P(32), P(16), P(8), P(4), P(2), and P(1) are calculated by a similar, though not identical process, as SECDED syndrome bits.

FIG. 4B is a matrix diagram depicting an exemplary embodiment of a parity bit positions matrix for N equal to 43. The calculation of parity bits, 32 bits at a time, proceeds as follows. The parity bits are initialized to 0. Then for each 32-bit word, selected subsets of the 32 bits are combined together by an exclusive disjunction, in other words, "XORed" together, as directed by matrix entries 202 in FIG. 2 and by matrix entries 403 and 402 in FIG. 4B. The resulting values are then XORed with the previous parity bit values, yielding new parity bit values. After all 32-bit words have been processed this way, the final parity bit values P(1024), P(512), P(256), P(128), P(64), P(32), P(16), P(8), P(4), P(2), and P(1) are XORed together and XORed with PDE, yielding the final value of PDE 411, as illustratively shown.

FIG. 4C is a matrix diagram depicting an exemplary embodiment of a syndrome bit positions matrix for N equal to 43. The calculation of syndrome bits, 32 bits at a time, is similar to that for the parity bits, using matrix entries 202 in FIG. 2 and entries 403 and 402 in FIG. 4C, except that after all 32-bit words have been processed, syndrome bits S(1024), S(512), S(256), S(128), S(64), S(32), S(16), S(8), S(4), S(2), and S(1) do not have to be XORed, and thus the resultant of this XORing does not have to be XORed with SDE 410.

One arrangement of data and parity bits would be to place them in their natural binary positions in a data block, with PDE assigned as P(0), namely, the overall parity bit for double error ("DE") detection occupying bit 0 position. After P(0), parity and data bits will alternate as follows:

Bit(s)
P(1), P(2)
D(3)
P(4)
D(5) ... D(7)
P(8)
D(9) ... D(15)
P(16)
D(17) ... D(31)
P(32)
D(33) ... D(63)
P(64)
D(65) ... D(127)
P(128)
D(129) ... D(255)
P(256)
D(257) ... D(511)
P(512)
D(513) ... D(1023)
P(1024)
D(1025) ... D(1311)

In this notation, each parenthesized data or parity index, for example (1) and (2), among others, denotes the syndrome value, represented in binary as S(1024) S(512) S(256) S(128) S(64) S(32) S(16) S(8) S(4) S(2) S(1), which identifies an associated data or parity bit as a bit in error for a single bit error indicated by SDE equaling 1.

Using the data block arrangement shown above, the calculation associated with FIG. 2 would suffice to compute the parity or syndrome bits. For the parity bit computation, the parity bits in the data block would be cleared to 0 before the computation. However, the exemplary embodiment constrains the placement of parity bits within the data block as follows: 660 data bits, 12 parity bits, 640 data bits, which may complicate the parity or syndrome calculation as previously described. Of course, other locations or relocations of parity bits may be used other than the example described. The complication of the parity or syndrome calculation may arise from an alternative calculation used for a particular 32-bit word containing the parity bits, and from different ranges of syndrome values used for the data bits to simplify avoiding syndrome values that are powers of 2 for data bits, since those syndrome values are reserved for the parity bits.

Accordingly, the following data block organization may be used:

D(704) ... D(1023)
D(1056) ... D(1395)
PDE
P(1), P(2), P(4), P(8)
P(16), P(32), P(64)
P(128), P(256), P(512)
P(1024)
D(1408) ... D(2047).

Breaking this block into 32-bit words, the data block organization can also be represented as follows: D(32×N) ... D(32×N+31) for N=22 through 31

D(32×N) ... D(32×N+31) for N=33 through 42 D(32×N) ... D(32×N+19) for N=
and occupying the remainder of the N=43 word:
PDE
P(1), P(2), P(4), P(8)
P(16), P(32), P(64)
P(128), P(256), P(512)
P(1024); and
D(32×N) ... D(32×N+31) for N=44 through 63.

In such an exemplary data block organization, all 32-bit words except one have the same basic structure, varying only the value of N. For these words, FIG. 2 exemplifies computation for the parity bits (e.g., P(1), P(2), etc.) and the syndrome bits (e.g., S(1), S(2), etc.).

Column labels 205 in FIG. 2 identify data bits by syndrome value for a given 32-bit word with a particular value of N within the ranges 22 through 31, 33 through 42, or 44 through 63. Each row within table entries 202 identifies the set of data bits referenced by 205 that are XORed into a particular parity bit 203 or syndrome bit 204 computed. A table entry equal to 1 in 202 indicates that the data bit referenced in 205 for the entry column is XORed into the parity bit or into syndrome bit referenced in bits 203 or in bits 204 for the entry row. For example, table entry 206 equal to 1 denotes that data bit D(32×N+11) is XORed into parity bit P(8) or into syndrome bit S(8). Conversely, a table entry equal to 0 indicates that the data bit so identified is not XORed into the indicated parity or syndrome bit.

A table entry of N is treated as 0 or 1 according to the binary representation of the value of N for a 32-bit word. For example, for N=22, the binary representation of N is 010110, and the table entries 202 are as shown in FIG. 3. Notably, the replacement of each column NNNNNN by 010110 is indicated generally at 208. The computations of parity and syndrome bits for the 32-bit word containing the parity bits (N=43) are different from that for the other words.

As mentioned above, FIG. 4B depicts a parity bit calculation. The interpretation of FIG. 4B is similar to that for FIG. 2 and follows from FIG. 4A. The parity bits, which are in process of being calculated, are completely ignored, as indicated by all table entries 408 being 0. Otherwise, the table is similar to FIG. 2 with N=43 (binary 101011). PDE calculation should include the XORing of the other parity bits, but it cannot be done until the final parity values are known. Therefore, the XORing of the other parity bits into PDE is done as a separate step, which follows the processing of all the 32-bit words.

As mentioned above, FIG. 4C depicts a syndrome bit calculation for a 32-bit word containing the parity bits. The interpretation of FIG. 4C is similar to that for FIGS. 2 and 4B. Continuing reference to FIG. 4C, table entries 409 are set according to the syndrome values for the parity bits, and all parity bits are XORed into SDE as given by 410. Otherwise, the table is similar to FIG. 4B, while both tables of FIGS. 4B, 4C are depicted in combination by FIG. 4A.

From the above description, it will be apparent to those of skill in the art of SECDED, that these calculations will determine parity bit values, and, subsequently, syndrome values suitable for SECDED operation. It may be noted, that parity bit values may be calculated and patched into the 1312-bit data blocks by software. Syndrome values may also be calculated in hardware, processing the data block 32 bits at a time. The following discussion, with reference to FIGS. 5, 6, and 6A, describes the realization of the syndrome calculation as defined by FIGS. 2, 4A and 4C in hardware.

Figure 5:
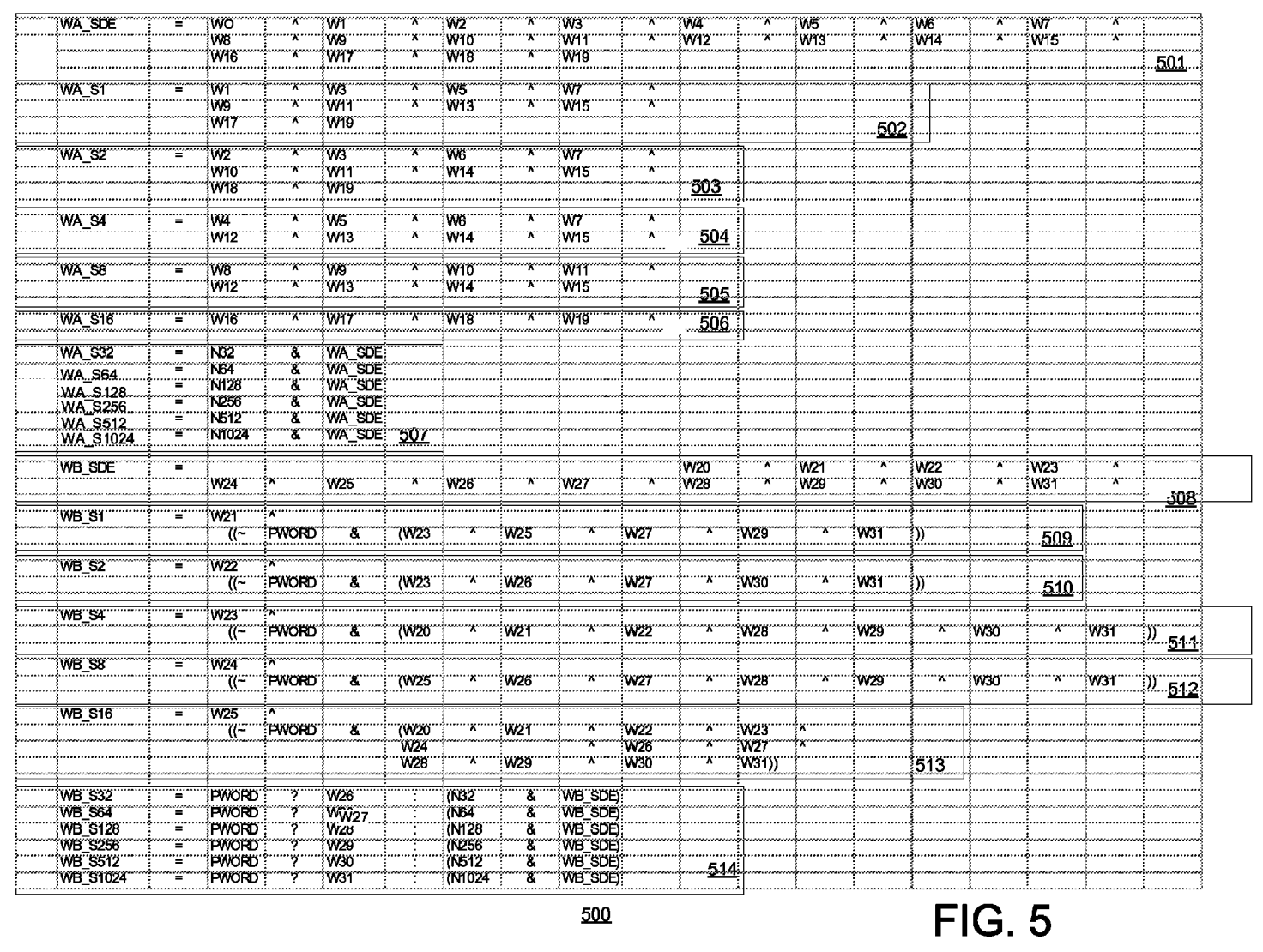

FIG. 5 is a listing of equations 500 for calculating a syndrome value in response to a word input. The following syntax was used for equations 500: "&" denotes a Boolean AND; "^" denotes a Boolean exclusive-OR ("XOR"); "~" denotes a Boolean complement; and "A ? B: C" denotes a multiplexing operator, such as "if A then B else C" or "(A&B)|(~A&C)" where "|" denotes a Boolean OR. Continuing the example, there are 32 bits, which may be data bits 205 or parity bits 203 denoted as W0 to W31. Bits N32, N64, N128, N256, N512 and N1024 are respectively associated with rows S32, S64, S128, S256, S512 and S1024.

Bits WA_SDE, WA_S1, WA_S2, WA_S4, WA_S8, WA_S16, WA_S32, WA_S64, WA_S128, WA_S256, WA_S512, and WA_S1024 form half of the equations, and bits WB_SDE, WB_S1, WB_S2, WB_S4, WB_S8, WB_S16, WB_S32, WB_S64, WB_S128, WB_S256, WB_S512, and WB_S1024 form the other half of the equations. Notably, "A" and "B" as in "WA" and "WB" are merely used as a naming convention to delineate bit ranges where parity bits in the example are not used and where they may be used, respectively. Dependency on N equal to 43 is indicated by "PWORD" being in the equation for determining binary values for syndrome bits WB_S1, WB_S2, WB_S4, WB_S8, WB_S16, WB_S32, WB_S64, WB_S128, WB_S256, WB_S512, and WB_S1024. Continuing the above example, bit PWORD equals one when count value, N, equals 43.

Bit WA_SDE is determined from equation 501, where bits W0 through W19 are all XOR'd. Bit WA_S1 is determined from equation 502, where bits W1, W3, W5, W7, W9, W11, W13, W15, W17, and W19 are all XOR'd. Bit WA_S2 is determined from equation 503, where bits W2, W3, W6, W7, W10, W11, W14, W15, W18, and W19 are all XOR'd. Bit WA_S4 is determined from equation 504, where bits W4, W5, W6, W7, W12, W13, W14, and W15 are all XOR'd. Bit WA_S8 is determined from equation 505, where bits W8 through W15 are all XOR'd. Bit WA_S16 is determined from equation 506, where bits W16 through W19 are all XOR'd. Equations 501 through 506 follow from bit position submatrix 403 of FIG. 4A, which matches the first 20 columns of matrix 200 of FIG. 2.

From equations 507, binary bit values for WA_S32, WA_S64, WA_S128, WA_S256, WA_S512, and WA_S1024 are determined. WA_S32 equals a bit value for WA_SDE AND'd with a binary bit value of N32. Recall, N for the example is in a range from 22 to 31, 33 to 42, 43, and 44 to 63. Recall, N equal to 32 is skipped as that value is used for a parity bit, and N equal to 43 is used for both data and parity bits within a transmitted word. WA_S64 equals a bit value for WA_SDE AND'd with a binary bit value for N64. WA_S128 equals a bit value for WA_SDE AND'd with a binary bit value for N128. WA_S256 equals a bit value for WA_SDE AND'd with a binary bit value for N256. WA_S512 equals a bit value for WA_SDE AND'd with a binary bit value for N512. WA_S1024 equals a bit value for WA_SDE AND'd with a binary bit value for N1024. Equations 507 follow from bit position submatrix 403 of FIG. 4A, which matches the first 20 columns of matrix 200 of FIG. 2.

Bit WB_SDE is determined from equation 508, where bits W20 through W31 are all XOR'd. Bit WB_S1 is determined from equation 509, where bit W21 is XOR'd with the result of the Boolean complement of the binary value of PWORD ("~PWORD") AND'd with the result of XOR'ng bits W23, W25, W27, W29, and W31. Bit WB_S2 is determined from equation 510, where bit W22 is XOR'd with the result of ~PWORD AND'd with the result of XOR'ng bits W23, W26, W27, W30, and W31. Bit WB_S4 is determined from equation 511, where bit W23 is XOR'd with the result of ~PWORD AND'd with the result of XOR'ng bits W20, W21, W22, W28, W29, W30, and W31. Bit WB_S8 is determined from equation 512, where bit W24 is XOR'd with the result of ~PWORD AND'd with the result of XOR'ng bits W25 through W31. Bit WB_S16 is determined from equation 513, where bit W25 is XOR'd with the result of ~PWORD AND'd with the result of XOR'ng bits W20 through W24 and W28 through W31. Equations 508 through 513 follow from bit position matrix 200 and submatrix 402 of FIGS. 2 and 4, respectively.

From equations 514, binary bit values for WB_S32, WB_S64, WB_S128, WB_S256, WB_S512, and WB_S1024 are determined. WB_S32 equals a binary bit value for WB_SDE AND'd with a binary bit value of N32 when PWORD is false (e.g., has a binary value of 0) and equals a binary bit value of W26 when PWORD is true (e.g., has a binary value of 1). WB_S64 equals a binary bit value for WB_SDE AND'd with a binary bit value of N64 when PWORD is false and equals a binary bit value of W27 when PWORD is true. WB_S128 equals a binary bit value for WB_SDE AND'd with a binary bit value of N128 when PWORD is false and equals a binary bit value of W28 when PWORD is true. WB_S256 equals a binary bit value for WB_SDE AND'd with a binary bit value of N256 when PWORD is false and equals a binary bit value of W29 when PWORD is true. WB_S512 equals a binary bit value for WB_SDE AND'd with a binary bit value of N512 when PWORD is false and equals a binary bit value of W30 when PWORD is true. WB_S1024 equals a binary bit value for WB_SDE AND'd with a binary bit value of N1024 when PWORD is false and equals a binary bit value of W31 when PWORD is true. Equations 514 follow from bit position matrix 200 and submatrix 402 of FIGS. 2 and 4, respectively.

Accordingly, WA signals indicate syndrome contribution due to W0 through W19, where there is no difference between bit position matrices 200 and 400 of FIGS. 2 and 4. Moreover, WB signals indicate syndrome contribution due to W20 through W31, where there is similarity between WA and WB signals for PWORD equal to 0, and differences between WA and WB signals when PWORD equals 1.

Figure 6:
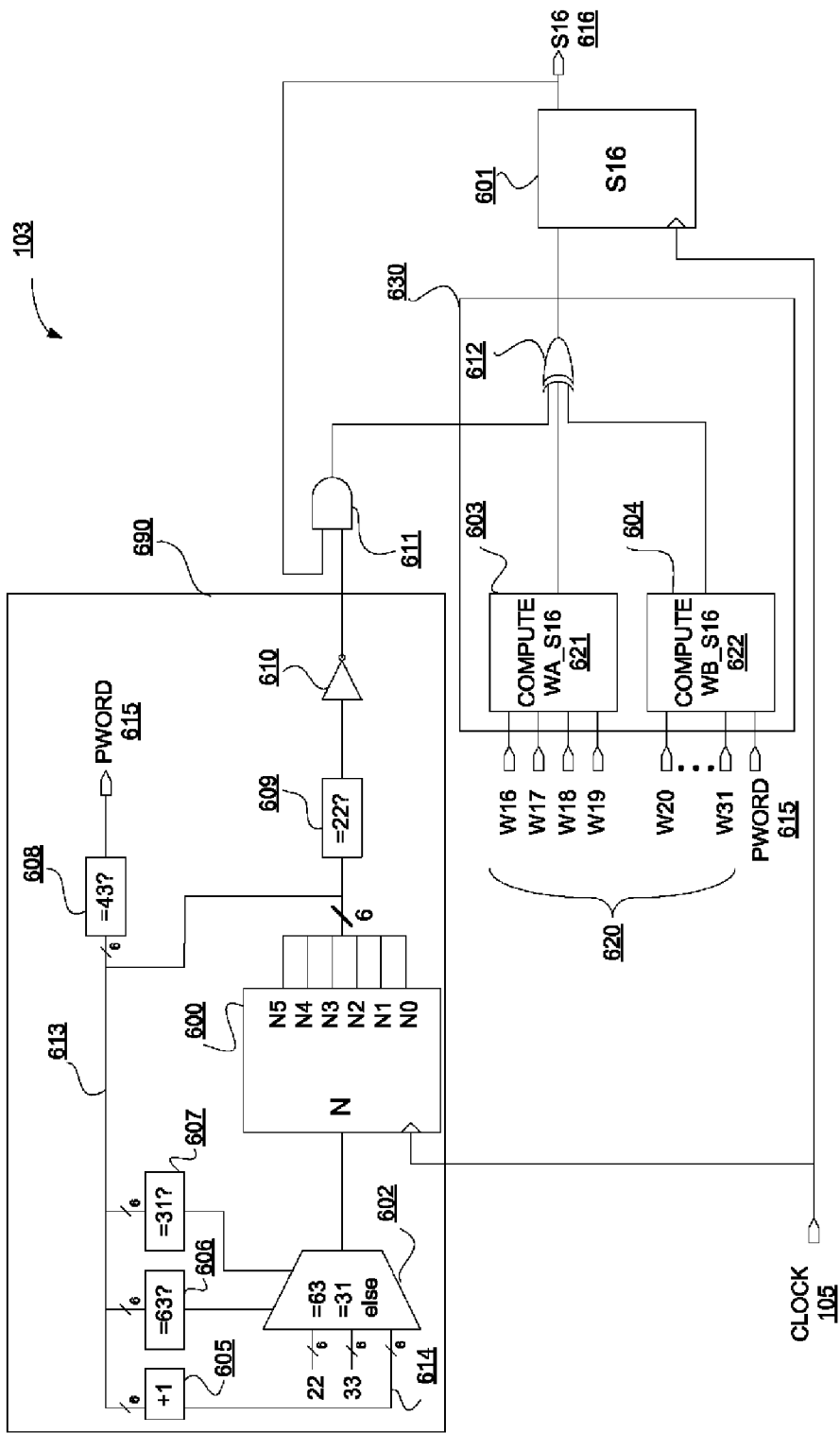
FIGS. 6 and 6A are block/schematic diagrams depicting an exemplary embodiment of a decoder.

FIG. 6 is a block/schematic diagram depicting an exemplary embodiment of a decoder 103. Decoder 103 includes a controller 690 having an N counter 600 and computation of syndrome bits logic block 630. For clarity, reset and data valid signals, which functions may be implemented by a person of ordinary skill in the art, are not shown. Notably, decoder 103 may be run with no gaps or reset needed between bitstream frames.

Clock signal 105 is provided to counter 600 and flip-flop 601. A word 620 from a bitstream frame is received. In the example, a word is 32 bits, namely, bits W0 though W31. For clarity, only syndrome bit S16 is shown for computation, as it will be readily apparent that syndrome bits logic block 630 may be implemented to compute other syndrome bits.

Accordingly, bits W16 through W31 for equations 506 and 513 of FIG. 5 are shown as data inputs to syndrome bits logic block 630.

Data inputs W16 through W19 are provided to combinatorial logic block 603 for computing WA_S16 in accordance with equation 506 of FIG. 5, and data inputs W20 through W31, as well as PWORD signal 615 output from comparator 608, are provided to combinatorial logic block 604 for computing WB_S16 in accordance with equation 513 of FIG. 5.

Prior to completing the description of syndrome bits logic block 630, maintenance of counter 600 is described.

Counter 600 counts responsive to clock signal 105 and output of multiplexer 602. A six bit wide output 613 of counter 600 is output to comparators 606 through 609 and to adder 605. Output from counter 600 is from a least significant bit, N0, to a most significant bit, N5. Notably, N0, N1, N2, N3, N4, and N5 provide the "N" values referenced in FIG. 2 for the computation of S32, S64, S128, S256, S512, and S1024, respectively. Accordingly, N0, N1, N2, N3, N4, and N5 in FIG. 6, as well as FIG. 6A below, respectively correspond to N32, N64, N128, N256, N512 and N1024 in FIG. 5.

Adder 605 may increment output of counter 600 by one. Adder 605 provides an incremented count signal 614 output as data input to multiplexer 602. Other data inputs to multiplexer 602 are fixed values, namely, in this example, respective binary value inputs for decimal values 22 and 33.

Comparator 606 is set to compare data input 613 in binary for a decimal value of 63, and comparator 607 is set to compare data input 613 in binary for a decimal value of 31. Comparator 608 is set to compare data input 613 in binary for a decimal value of 43, and comparator 609 is set to compare data input in binary for a decimal value of 22. The reset value for counter 600 is 22.

Outputs from comparators 606 and 607 are used as control select signals to multiplexer 602. For example, if output of counter 600 is the binary value of 31, then output of comparator 607 causes multiplexer 602 to select a binary input for the decimal value of 33 as an output to counter 600 to skip the decimal value of 32. If output of counter 600 is the binary value of 63, then output of comparator 606 causes multiplexer 602 to select a binary input for the decimal value of 22 as an output to counter 600 to reset the count. If output of counter 600 is neither 63 nor 31, then output of multiplexer 602 is incremented count signal 614 of adder 605.

If output of counter 600 is the binary value of 43, then output of comparator 608 causes PWORD signal 615 to transition from low (e.g., a binary zero) to high (e.g., a binary one) to indicate that both data and parity bits are in the current word 620.

If output of counter 600 is 22, meaning an entire bitstream frame has been received or a first word in a bitstream has been received, output of comparator 609 transitions from low to high. When output of counter 600 goes to 23, output of comparator transitions from high to low and stays low until output of counter 600 is 22 again. Output of comparator 609 is provided to input of inverter 610, and output of inverter 610 is provided to an input of AND gate 611. Accordingly, input to AND gate 611 coupled to comparator 609 transitions is low responsive to output of counter 600 being 22, and is high responsive to output of counter 600 not being 22.

It should be understood that an entire syndrome for a bitstream frame is computed over multiple clock cycles of clock signal 105. Continuing the above example, there are 41 cycles of clock signal 105 to calculate a syndrome for a bitstream frame. Thus, partial values of a syndrome are used until there is an indication that a new data vector is being received, such as when output of counter 600 equals 22. Output of flip-flop 601 is a syndrome bit value signal 616, which for this example is S16 signal 616. A partial value for S16 is represented by S16 signal 616 for all counts of N, except a final count of N equal to 63. However, a partial value for S16 of a prior iteration of determining a syndrome for a data vector is not used for a subsequent determination of a next data vector, such as when N equals 22.

Thus, S16 signal 616 is fed back as an input to AND gate 611. For all values of N other than 22, AND gate 611 outputs S16 signal 616 as an input to XOR gate 612, along with inputs of WA_S16 and WB_S16 as respectively output from combinatorial logic blocks 603 and 604. XOR'ng WA_S16, WB_S16 and a partial syndrome S16 from a prior iteration produces another partial syndrome S16 which is stored in flip-flop 601 subject to a clock cycle, as flip-flop 601 is clocked by clock signal 105. The value of S16 stored in flip-flop 601 is a partial syndrome value until a last word 620 of a bitstream frame is processed, in which event the value of S16 stored in flip-flop 601 is the syndrome value for S16 for the bitstream frame processed. When a next bitstream value is to be processed, the syndrome value for S16 from the prior bitstream frame is fed back as an input to AND gate 611. However, because output of counter 600 is 22 for a first word of a new bitstream frame, output of AND gate 611 is a binary zero. Thus, the syndrome value from the prior bitstream frame is not used for on the first word of the next bitstream frame. Thus, AND gate 611 acts as a feedback filter.

Figure 6A:
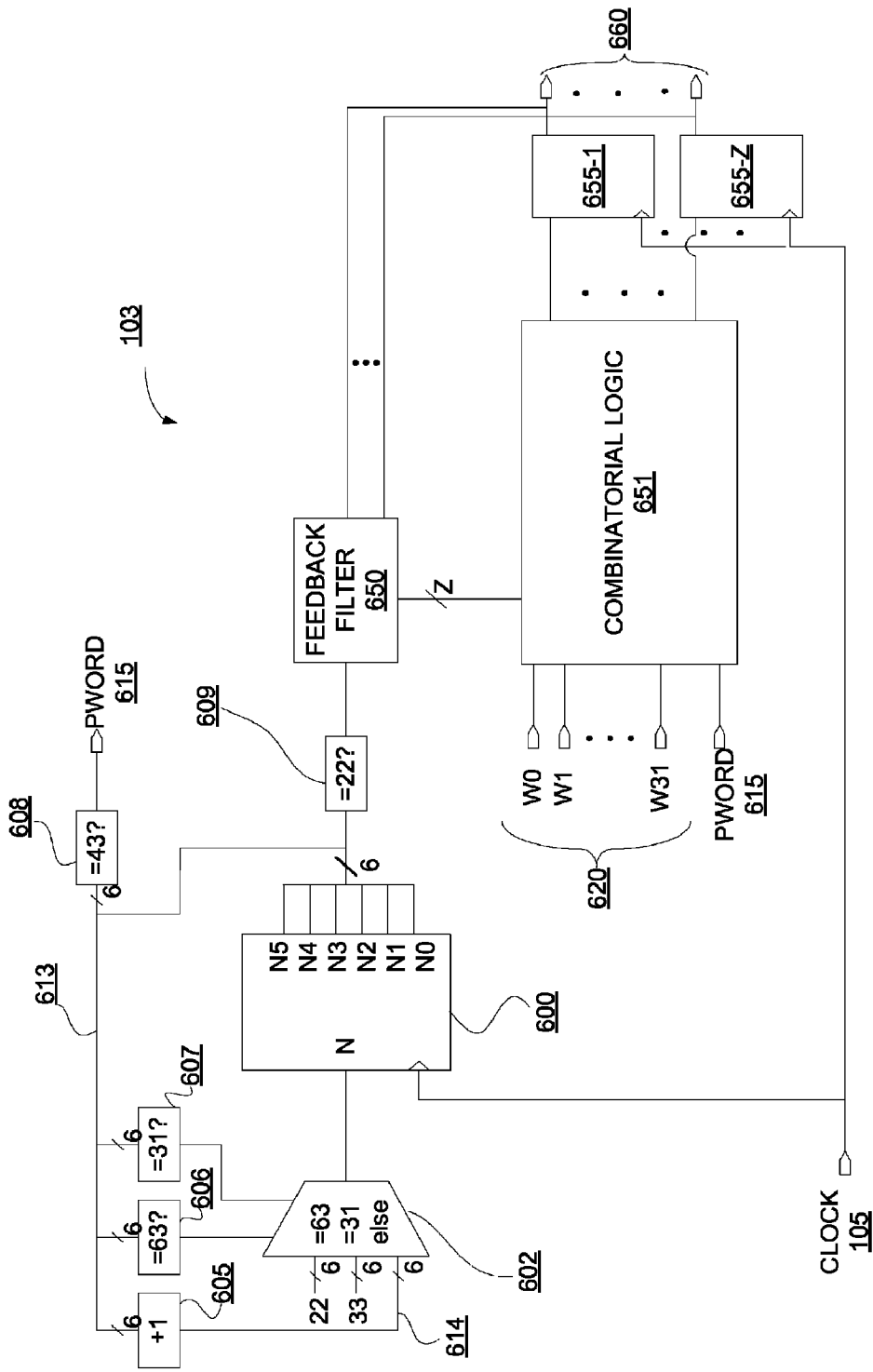

However, other forms of logic, other than those described herein, may be used. Accordingly, FIG. 6A is a more generalized depiction of decoder 103 of FIG. 6. Each word 620 of word bits W0 through W31, as well as PWORD signal 615, is provided to combinatorial logic 651. Combinatorial logic 651 is configured in accordance with equations described elsewhere herein for producing respective syndrome bit values, which are respectively input to flip-flops 655-1 through 655-Z, for Z an integer (collectively "flip-flops 655"). In the example herein, Z is twelve, as there are twelve syndrome bits S1, S4, S8, S16, S32, S64, S128, S256, S512, S1024 and SDE. Flip-flops 655 produce syndrome bit values, including, but not limited to, partial syndrome bit values, for data vectors formed of words 620. Output of flip-flops 655 is fed back as input to feedback filter 650. Another input of feedback filter 650 is output of comparator 609. There are Z partial syndrome bit outputs from feedback filter 650 for values of N other than a counter reset value, such as 22, and there are Z zero values of outputs from feedback filter 650 for N equal to a counter reset value, such as 22. Output from feedback filter 650 is provided to combinatorial logic 651 for determining syndrome bit values.

Figure 7:
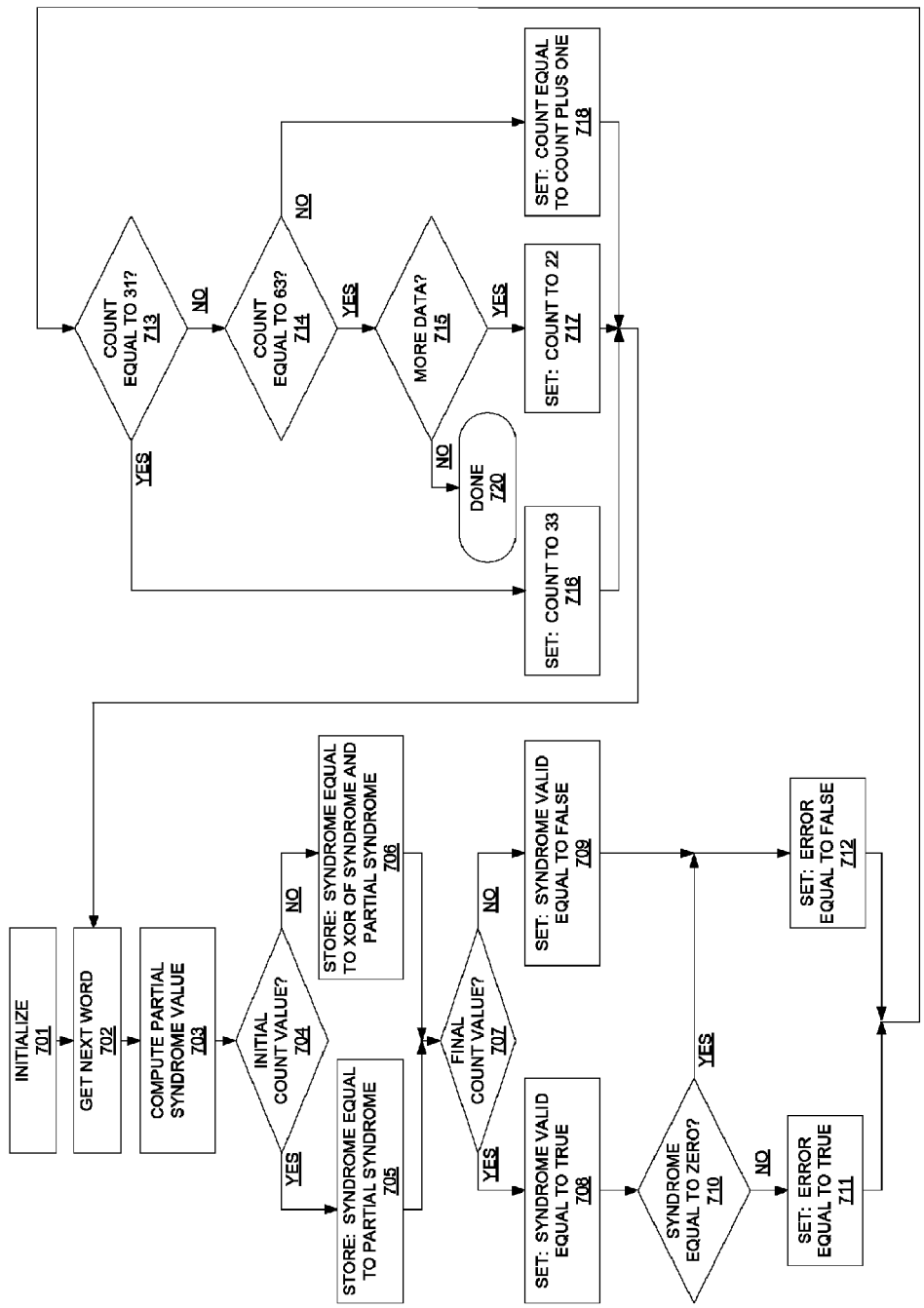
FIG. 7 is a flow diagram depicting an exemplary embodiment of a syndrome bit value flow.

FIG. 7 is a flow diagram depicting an exemplary embodiment of a syndrome bit value flow 700. At 701 variables are initialized. For example, count may be initialized, for example bits 0 through 5 output from a counter may be initialized to 22; syndrome bits may be initialized, for example bits 0 through 11 may be set to 0; error may be set to false; and syndrome valid may be set to false.

At 702, a first or a next word, such as 32 bits, is obtained from a data vector. Notably, if there is no data to be obtained syndrome bit value flow 700 waits at 702 until there is data to be obtained.

At 703, a partial syndrome value is computed from bits read at 702.

At 704, a check is made to determine if the count value is the initial count value, such as 22, for a data vector. If the count value is the initial count value, then at 705 the partial syndrome computed at 703 is stored as the syndrome at 705. If, however, at 704 the count value is not the initial count value, then at 706 the partial syndrome computed at 703 is XOR'd with a stored syndrome the result of which is stored as the syndrome. If the bits read at 702 are for a last word of a data vector, then at 706 the value computed and stored is the final syndrome value for the data vector.

At 707, it is determined if the count is the final count value. If the count is not the final count value, then at 709 syndrome valid is set equal to false, meaning that there is more data to process to obtain a syndrome for a data vector, and at 712 error is set equal to false, meaning that it is not yet possible to verify whether the data transmitted was sent and received without error.

If at 707 the count value is the final count value, then at 708 syndrome valid is set equal to true, meaning that a final syndrome value has been computed for a data vector. At 710, it is determined whether the final syndrome value is zero, such as a binary 0000. If the data vector is sent and received without error, the final syndrome value will be all binary zeros. If the final syndrome value is zero, then at 712 error is set equal to false, meaning that all data of a data vector was sent and received without error. If, however, at 710 it is determined that the syndrome does not equal zero, then at 711 error is set equal to true, meaning that there was an error in the transmission. Notably, error handling may be done in a conventional manner, and thus is not described herein for purposes of clarity.

In another embodiment if at step 710 the syndrome is equal to zero, then SDE=0, and there is no error and step 712 is done next. If at step 710 the syndrome is not equal to zero, then the SDE is checked. If SDE=0 then two bits are in error, the error is non-correctable, and step 711 is done next. If SDE=1 then the syndrome value gives the bit position of the data or parity bit in error, the bit in error is corrected by inversion (step not shown), and step 712 is done.

At 713, it is determined whether count is equal to a value immediate prior to a power of two value, such as 31. Recall, power of two output bits are reserved for parity bits. If count is a value immediately prior to a power of two value, then at 716 such power of two value is skipped, such as going from 31 to 33 to skip 32, and at 702 another word is obtained. If count is not a value immediately prior to a power of two value, then at 714 it is determined whether count is for a last word of a data vector, such as count equal to 63. If count is not for a last word, then count is incremented by one at 718 and another word for the data vector is obtained at 702. If, however, count is for a last word, then at 715 it is determined whether there is another data vector to process. If there is no other data vector to process, then at 720 syndrome bit value flow 700 ends. If, however, there is another data vector to process, then at 717 count is reset to an initial value, such as 22, and at 702 a first word of the next data vector to process is obtained.

Notably, the equations used herein may be implemented in logic, with or without logic optimizations. For example, an output control signal from comparator 607 ("=31") of FIG. 6 may be OR'd with the least significant bit of counter 600 to effect a next value after 31 of 33, and thus the fixed value of 33 input to multiplexer 602 may be omitted and only one control signal, namely, the one from comparator 606 ("=63") would be implemented for controlling multiplexer 602. Additionally, common subexpressions may be shared between WA and WB combinatorial logic blocks, as well as shared between syndrome bit logic blocks.

Figure 8:
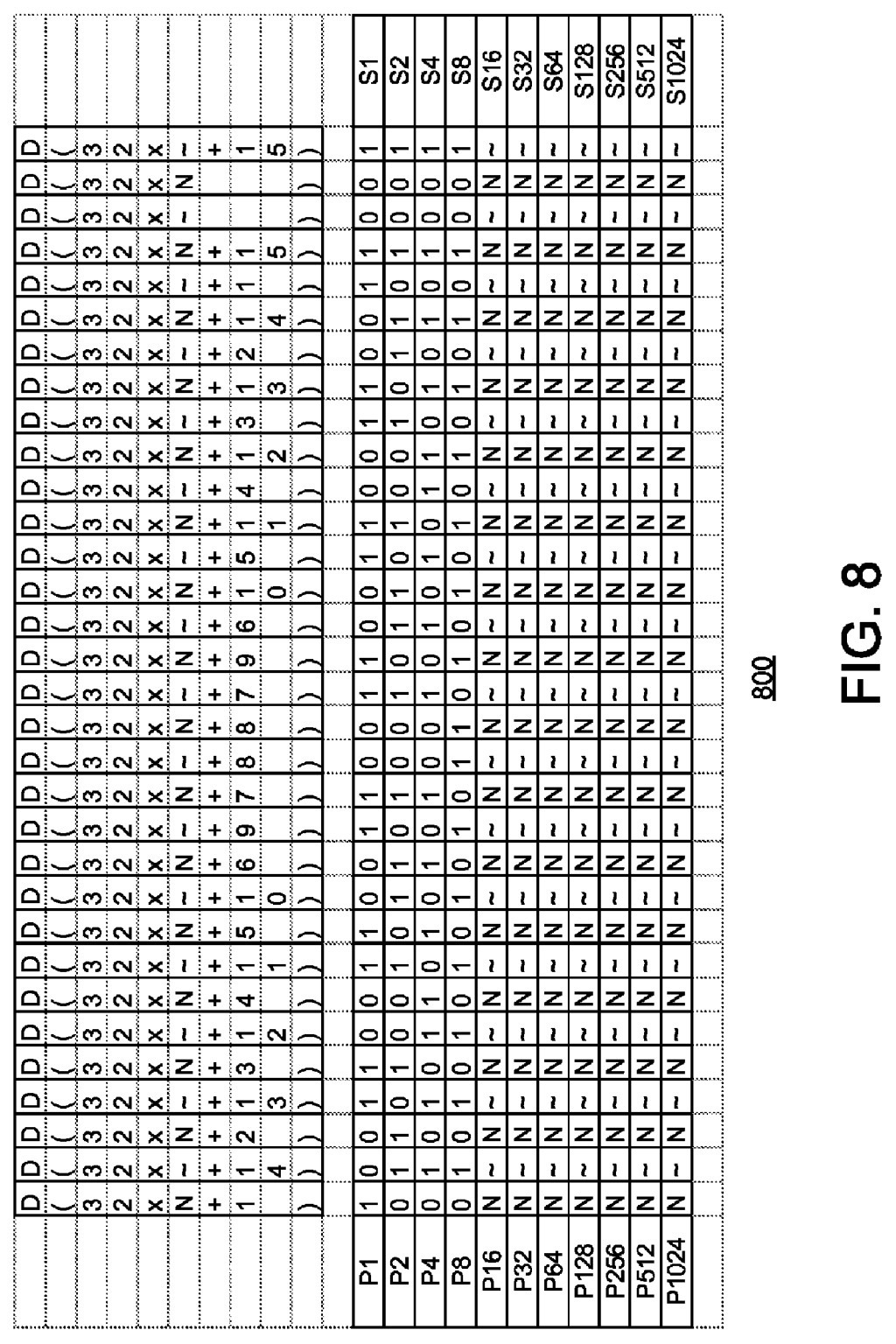

Furthermore other assignments of bit numbers to bitstream frame bits may be used. For example, an extra bit in counter 600 of FIG. 6 may be added, as well as having both uncomplemented and complemented counter 600 output values. FIG. 8 is a matrix diagram depicting an exemplary embodiment of bit positions matrix 800 for an extra bit in a counter and having a complement of N. In rows P16/S16 through P1024/S1024, "N" denotes use of a counter value output of an N counter and "~" denotes use of a complement of a counter value output of the N counter. For selection of N, there must not be duplicates between complemented and uncomplemented values of N, and each complemented and uncomplemented value of N cannot be a power of two. A sample set of values may be decimal 65 through 106, skipping 95, with complemented values 62 through 21, skipping 32.

Figure 9:
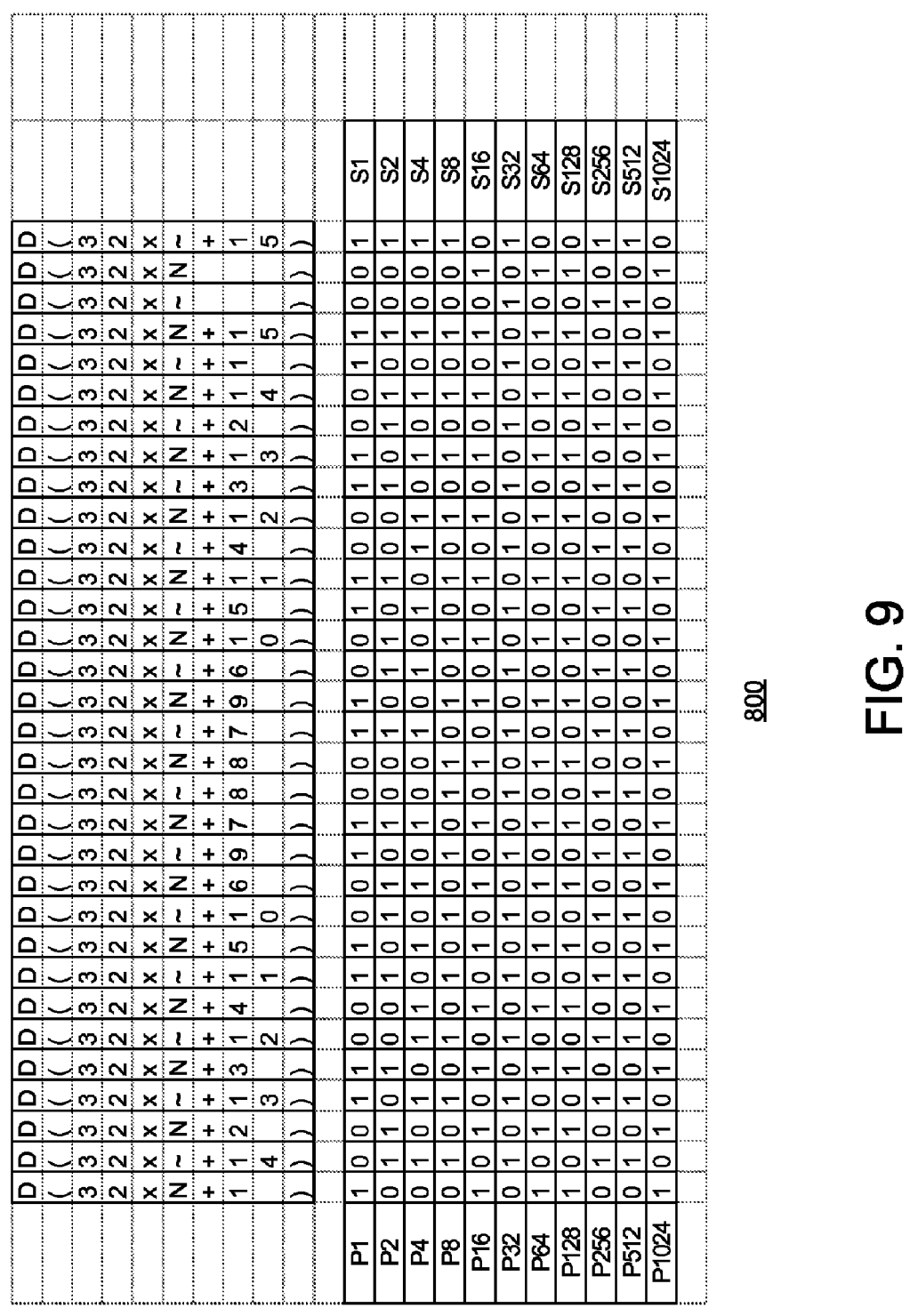

FIG. 9 is a matrix diagram depicting an exemplary embodiment of bit positions matrix 800 for N equal to binary 1001101. The ones complement of N equals binary 0110010.

Figure 10:
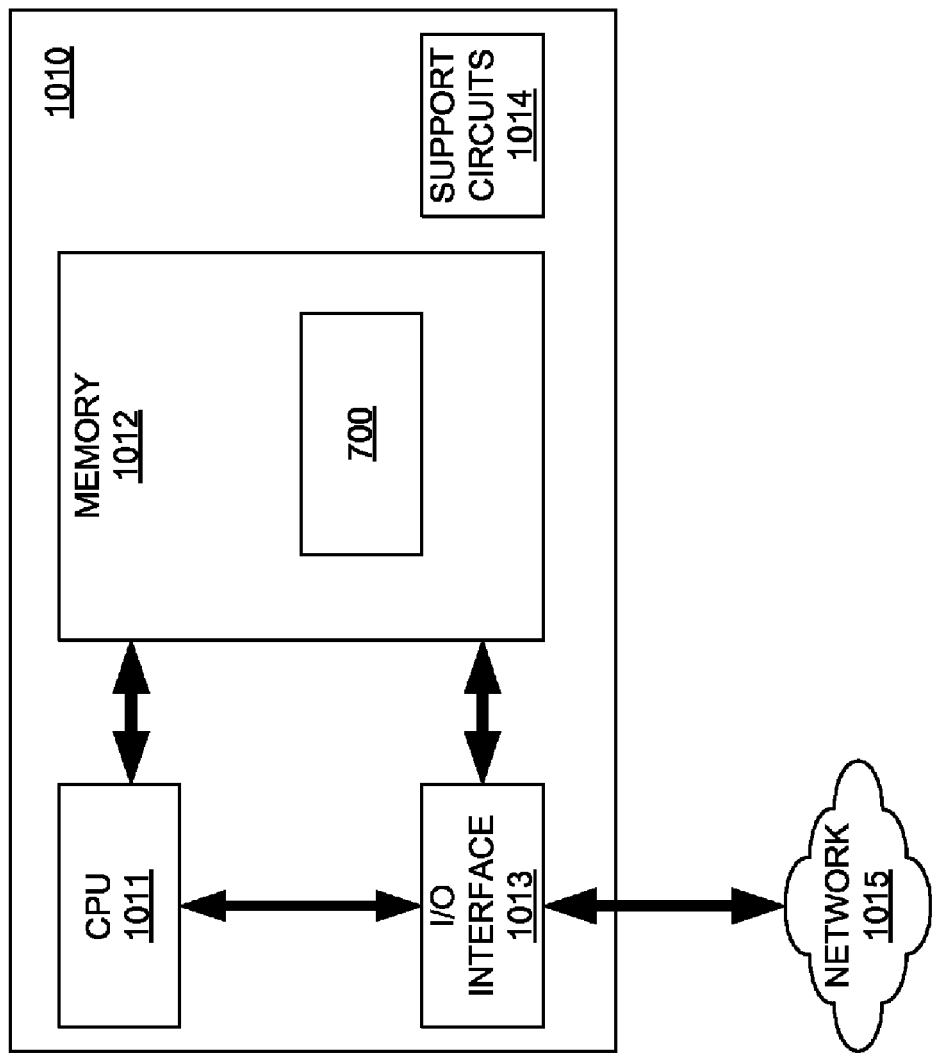
FIG. 10 is a block diagram depicting an exemplary embodiment of a computer coupled to a network.

FIG. 10 is a block diagram depicting an exemplary embodiment of a computer 1010 coupled to a network 1015. Encoded information may be transmitted from network 1015 for decoding by computer 1010. Computer 1010 includes input/output interface 1013, central processing unit 1011, memory 1012 and support circuits 1014. Memory 1012 may store machine-readable computer program code for error checking encoded information in accordance with syndrome bit value flow 700. Program(s) of the program product defines functions of embodiments in accordance with one or more aspects of the invention and can be contained on a variety of signal-bearing media, such as computer-readable media having code, which include, but are not limited to: (i) information permanently stored on non-writable storage media (e.g., read-only memory devices within a computer such as CD-ROM or DVD-RAM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of one or more aspects of the invention represent embodiments of the invention.

In summary, transmitted encoded information includes data bits and parity bits. Syndrome bits are determined by computing a partial syndrome value for each word (W0 through W31) serially transmitted of the encoded information, where the encoded information includes one or more data vectors. Location (N) of each word (W0 through W31) of the encoded information is identified. It is determined whether a partial syndrome value is an initial partial syndrome value or other partial syndrome value responsive to word location (N). An initial partial syndrome value is stored, and subsequent partial syndrome values are cumulatively added for each word (W0 through W31) of a data vector to arrive at a syndrome value for the data vector. All parity bits for a data vector may be stored in a single word of the data vector.

Figure 11A:
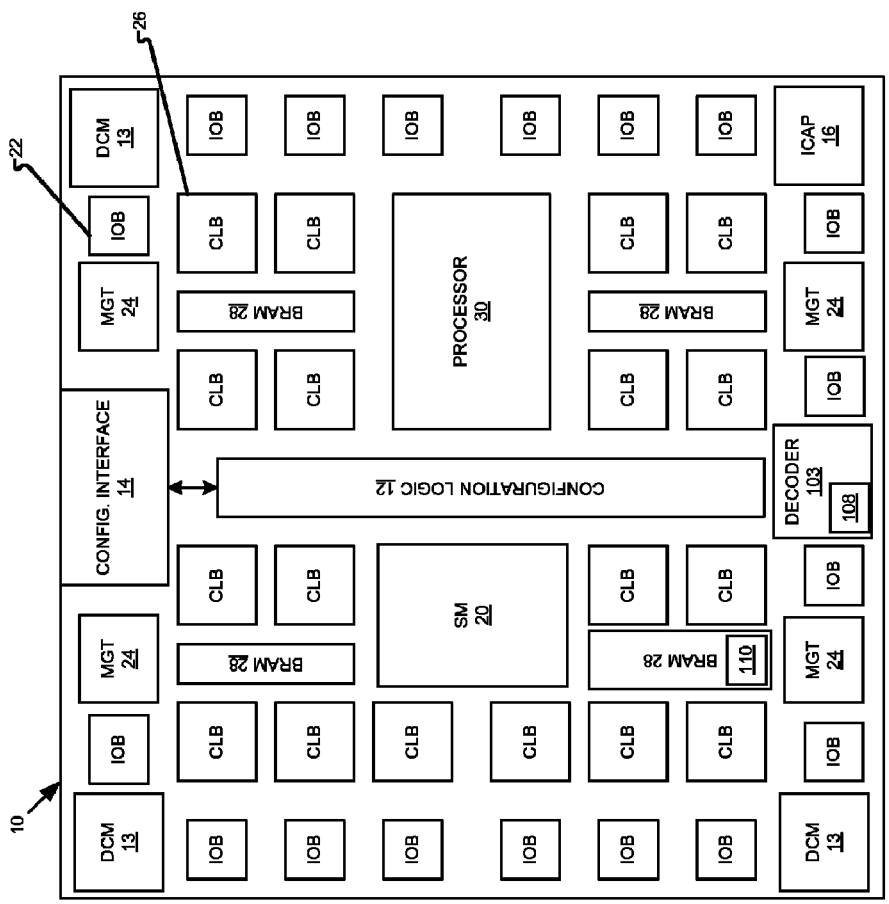
FIG. 11A is a high-level block diagram depicting an exemplary embodiment of a Field Programmable Gate Array ("FPGA").

FIG. 11A is a high-level block diagram depicting an exemplary embodiment of a Field Programmable Gate Array ("FPGA") 10. FPGA 10 is an example of an integrated circuit with software configurable logic and interconnects. However, other Programmable Logic Device ("PLD") integrated circuits other than Field Programmable Gate Arrays ("FPGAs"), including complex PLDs ("CPLD") and other integrated circuits with configurable logic and interconnects, may be used.

FPGA 10 includes configurable logic blocks ("CLBs") 26, programmable input/output blocks ("IOBs") 22, memory, such as block random access memory 28, delay lock loops ("DLLs") and multiply/divide/de-skew clock circuits which collectively provide digital clock managers ("DCMs") 13, and multi-gigabit transceivers ("MGTs") 24.

An external memory may be coupled to FPGA 10 to store and provide a configuration bitstream to configure FPGA 10, namely, to program one or more configuration memory cells, for example to configure CLBs 26 and IOBs 22. Notably, IOBs 22, as well as MGTs 24, are disposed in a ring or ring-like architecture forming a perimeter of I/Os around CLBs 26 of FPGA 10.

Additionally, FPGA 10 may include an Internal Configuration Access Port ("ICAP") 16, an embedded processor 30, an embedded system monitor 20 with an Analog-to-Digital Converter ("ADC"). Though FPGA 10 is illustratively shown with a single embedded processor 30, FPGA 10 may include more than one processor 30. Additionally, known support circuitry for interfacing with embedded processor 30 may be included in FPGA 10. Furthermore, rather than an embedded processor 30, processor 30 may be programmed into configurable logic such as a "soft" processor 30.

Although FIG. 11A illustratively shows a relatively small number of IOBs 22, CLBs 26 and BRAMs 28, for purposes of example, it should be understood that an FPGA 10 conventionally includes many more of these elements. Additionally, FPGA 10 includes other elements, such as a programmable interconnect structure and a configuration memory array, which are not illustratively shown in FIG. 11A. Additional details regarding an example of an FPGA are described in "Virtex-II™ Pro Platform FPGA Handbook" (Oct. 14, 2002), which includes "Virtex-II Pro™ Platform FPGA Documentation" (March 2002) "Advance Product Specification," "Rocket I/O Transceiver User Guide", "PPC 405 User Manual" and "PPC 405 Processor Block Manual" available from Xilinx, Inc., 2100 Logic Drive, San Jose, Calif. 95124. FPGA 10 is configured in response to a configuration information (commands and data) bitstream, which is loaded into a configuration memory array of FPGA 10 from an external memory, e.g., a read-only memory ("ROM"), via configuration interface 14 and configuration logic 12. Configuration interface 14 can be, for example, a select map interface, a Joint Test Action Group ("JTAG") interface, or a master serial interface. Alternatively, with respect to external configuration or reconfiguration, FPGA 10 may be internally reconfigured through use of ICAP 16 or a dynamic reconfiguration port 108. A dynamic reconfiguration port is described in additional detail in commonly assigned U.S. Pat. No. 7,218,137, issued May 15, 2007, entitled "Reconfiguration Port for Dynamic Reconfiguration," by Vasisht M. Vadi et al., which is incorporated by reference herein in its entirety.

Configuration data is conventionally divided out into data frames. Configuration data may be loaded into the configuration memory array one frame at a time via configuration interface 14 or ICAP 16, or in sub-frame increments via dynamic reconfiguration port 108.

With continuing reference to FIG. 11A, and renewed reference to FIG. 1, decoder 103 may be an embedded or dedicated function block, or one or more circuit elements of decoder 103 may be provided via one or more programmable circuit elements of FPGA 10.

Encoded information 101, such as a configuration bitstream, may be initially received by decoder 103 via configuration interface 14. A decoded configuration bitstream may be checked for errors using decoder 103 to initially configure FPGA 10.

After a configuration bitstream has been written to configuration memory of FPGA 10, configuration data may be read back ("readback operation" or "readback") from configuration memory of FPGA 10. For example, configuration data written to configuration memory may be read back to guard against a Single Event Upset (SEU) induced error. This readback operation may be done on a sub-frame basis with dynamic reconfiguration port 108 or on a frame basis with ICAP 16 or configuration logic 12. For an FPGA-internal readback operation, decoder 103 may read back configuration data via ICAP 16 or dynamic reconfiguration port 108. Additional details regarding reading back configuration data are described in commonly assigned U.S. Pat. No. 7,109,746, issued Sep. 19, 2006, entitled "Data Monitoring for Single Event Upset in a Programmable Logic Device", by Martin L. Voogel et al., which is incorporated by reference herein in its entirety.

In the initial decoding of encoded configuration information 101, pre-calculated parity or ECC bits are used for decoding. For a fixed error correction code (ECC), such bits are fixed values. ECC bits for each data frame are stored in BRAM 28. A table of indices to maintain association between ECC bits and data frames may be stored with ECC bits.

Configuration data read back and associated ECC bits are used to calculate a syndrome value by decoder 103. For purposes of clarity and not limitation, the above example is continued, namely, that syndrome values are calculated based on a frame of data. If after a last word of a frame has been read and the syndrome value calculated including the last word has a zero value, then there is no error. However, if the syndrome value is a non-zero value, then an error has been detected. An error signal may be asserted along with a syndrome value, such as a 12-bit output.

If a single-bit error is detected, such an error may be corrected with a write-back operation to write over a correct value for the bit error. This is because a syndrome value will indicate location of a single-bit error. Such a write-back may be done on a sub-frame basis with dynamic reconfiguration port 108 or on a frame basis with dynamic reconfiguration port 108, ICAP 16 or configuration logic 12. For two or more bit errors in a data frame, the entire frame is re-written to configuration memory. Re-writing a frame may be done with a full or partial reconfiguration. It should be appreciated that though a frame of data is used to compute a syndrome value, the syndrome value may be read back in sub-frame increments or words for computation of partial syndrome values as previously described to arrive at a final syndrome value.

Notably, some bits in a configuration bitstream may intentionally be changed during operation of an FPGA. For example, bits used to configure a function generator to act as a look-up table random access memory or a shift register, as described in commonly assigned U.S. Pat. No. 7,109,746, which is incorporated by reference herein in its entirety. Moreover, some bits are available to be reconfigured during operation, namely, dynamically reconfigurable bits, as described in commonly assigned U.S. Pat. No. 7,102,555, issued Sep. 5, 2006, entitled "Boundary-Scan Circuit Used for Analog and Digital Testing of an Integrated Circuit," by Anthony J. Collins et al., which is incorporated by reference herein in its entirety. As pre-determined ECC bits calculated for each frame should not change, bits which are allowed to change as part of a design instantiated in an FPGA are masked out. This may be done by forcing affected frame bits to be read back as all zeros regardless of their actual value, such that ECC values are calculated based on reading back all zeros rather than the actual values. Masking bits for readback is described in additional detail in commonly assigned U.S. Pat. No. 7,109,746.

Figure 11B:
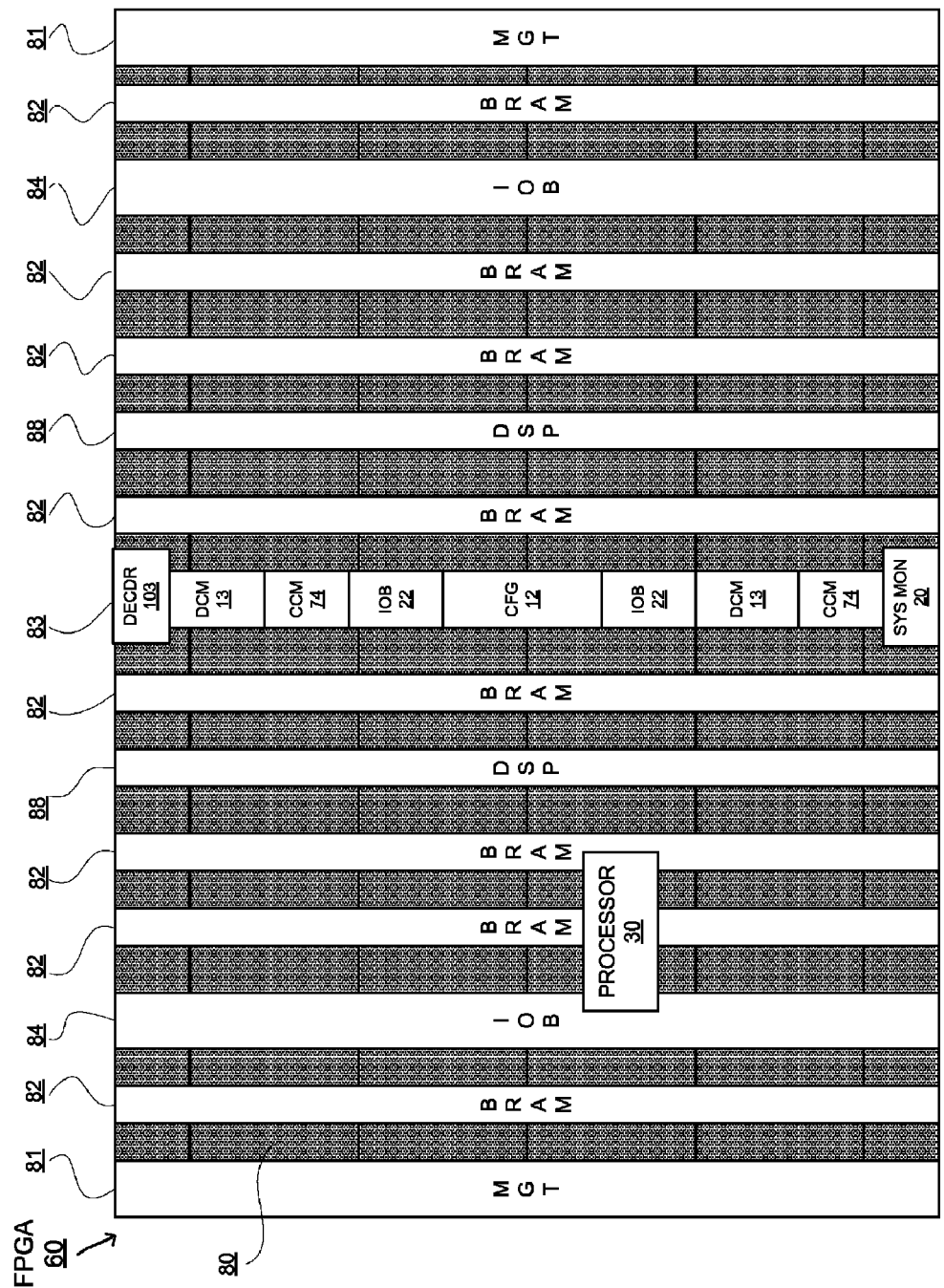
FIG. 11B is a high-level block diagram depicting another exemplary embodiment of an FPGA with a "columnar" architecture and with an embedded processor.

FIG. 11B is a high-level block diagram depicting another exemplary embodiment of an FPGA 60 with a "columnar" architecture and with an embedded processor 30. Notably, architectures, other than the columnar architecture described herein, may be used. A column of MGTs 81 may be disposed on opposite sides of FPGA 60. Programmable fabric 80, which may include CLBs and programmable interconnects, may be used to respectively couple columns of MGTs 81 to columns of BRAMs 82. Programmable fabric 80 may be used to couple columns of BRAMs 82 to one another and to columns of IOBs 84. This inward progression on two opposing sides of FGPA 60 of coupling columns may continue until a center or generally centrally located column 83 is reached.

Center column 83 may be coupled to columns of BRAMs 82 via programmable fabric 80. Center column 83 may include function logic blocks. Function logic blocks may, for example, include a system monitor ("SYS MON") 20, one or more DCMs 13, one or more clock companion modules ("CCMs"), and configuration logic ("CFG") 12, and one or more IOBs 22, among other function logic blocks. Notably, not all function blocks have to be located in center column 83. For example, Digital Signal Processors ("DSPs") may be instantiated in columns of DSPs 88, which are coupled to columns of BRAMS 82 via programmable fabric 80. Alternatively, one or more DSPs may be included in center column 83.

System monitor 20 may include an ADC to monitor parameters like temperature and voltage, both internally ("on-chip") and externally ("off-chip"). Decoder 103 may be instantiated generally at the top of center column 83 of FPGA 60 to provide decoding as described with reference to FIG. 11A.

DCMs 13 may include circuits to perform clock de-skew, clock phase shifting, clock frequency synthesis, and other clock features. CCMs 74 may include circuits for phase-matched binary clock division and internal clock jitter and skew measurement.

Configuration logic 12 includes logic used to address and load configuration information into configuration memory cells, such as SRAM-based configuration memory cells, during configuration of FPGA 60 from an externally supplied bitstream. Configuration logic 12 may include configuration registers, boundary scan test circuitry, such as JTAG circuitry, and encryption or decryption circuitry used to respectively encrypt or decrypt bitstreams of configuration data loaded into or read out of FPGA 60 as applicable. Additional details regarding FPGA 60 may be found in a commonly assigned U.S. Pat. No. 7,187,200, issued Mar. 6, 2007, entitled "Columnar Architecture," by Steven P. Young, which is incorporated by reference herein in its entirety.

Figure 11C:
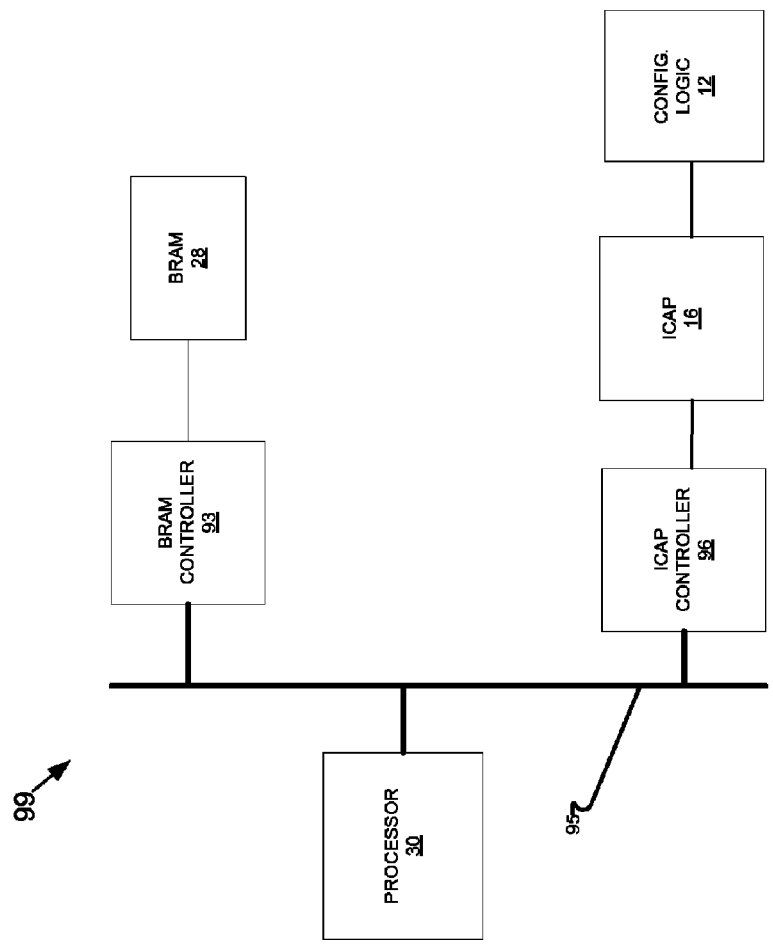
FIG. 11C is a block diagram depicting an exemplary embodiment of an internal configuration/reconfiguration ("configuration") interface.

FIG. 11C is a block diagram depicting an exemplary embodiment of an internal configuration/reconfiguration ("configuration") interface 99. Internal configuration interface 99 includes a processor 30, a BRAM controller 93, at least one BRAM 28, an ICAP controller 96, and ICAP 16, and configuration logic 12. BRAM controller 93 and ICAP controller 96 may be instantiated using configurable logic and programmable interconnects to provide bus 95 connectivity with processor 30. Configuration interface 99 is described in additional detail in a commonly assigned U.S. Pat. No. 6,920,627, issued Jul. 19, 2005, entitled "Reconfiguration of a Programmable Logic Device Using Internal Control," by Brandon J. Blodget et al., which is incorporated by reference herein in its entirety.

Figure 12A:
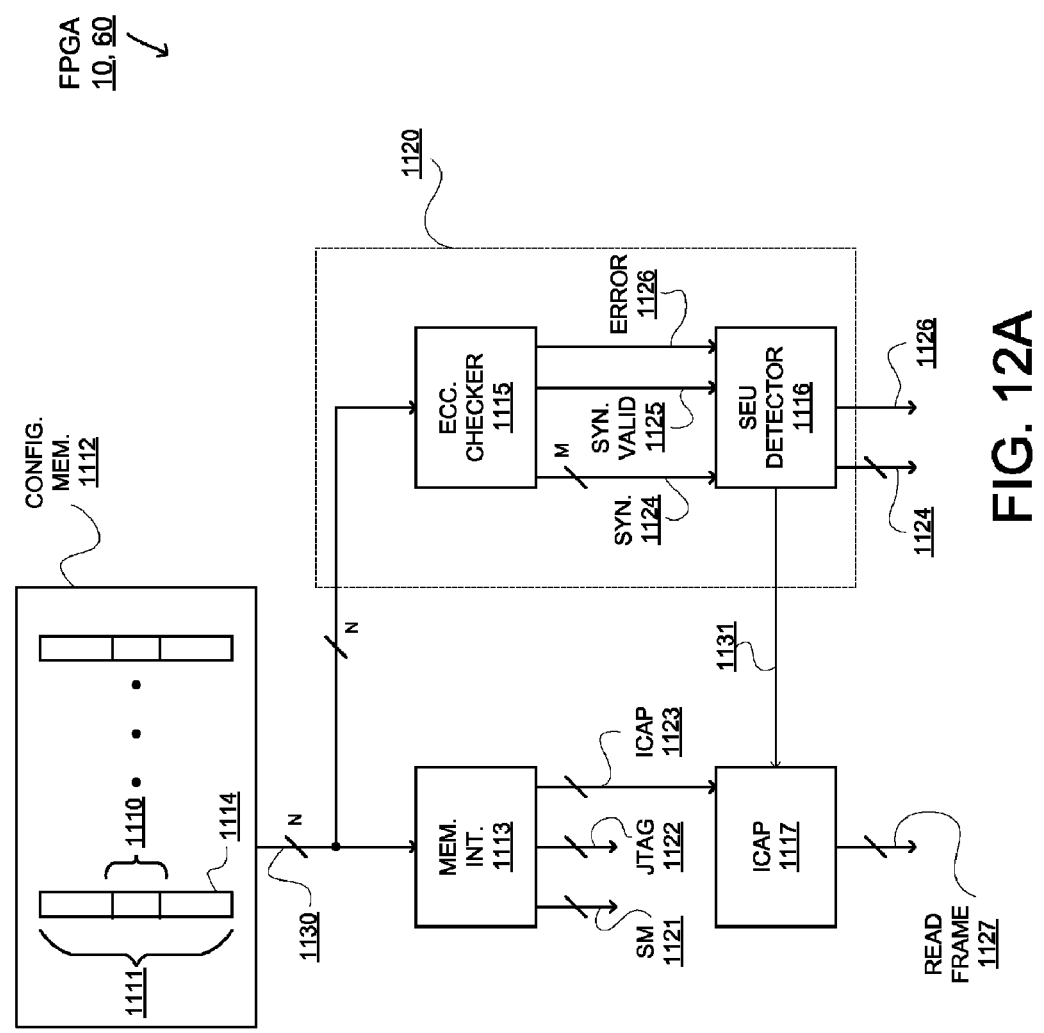
FIG. 12A is a block diagram depicting an exemplary embodiment of readback circuit in a programmable logic device.

FIG. 12A is a block diagram depicting an exemplary embodiment of a readback circuit 1120 in an FPGA 10 or 60. As previously described, configuration information is decoded and written to configuration memory 1112.

Configuration memory 1112 may include columns of memory cells 1114, such as SRAM cells. A frame of configuration data 1111 may be stored in a column of memory cells 1114. Notably, memory cells need not be arranged in 1-by-1312, for example, columns, but may be in any arrangement suitable for storing frames of data.

Parity bits 1110 may be at least approximately centrally stored in such column of memory cells 1114. For example, a frame of 1312 bits may include 12 centrally disposed parity bits. So, for example, a frame of bits for configuration information is generated, exclusive of the parity bits. From this frame of bits, parity bits are generated and added into the frame of bits. Notably, these bits do not have to be located centrally to the frame. For example, in Hamming code, error correction code ("ECC") bits are conventionally located at the end of a frame of bits.

Configuration data 1111 may be read out of configuration memory 1112 N bits at a time, for N an integer such as 8, 16, 32, and so on. Thus, several cycles of reads may be invoked to read out an entire frame of configuration data 1111. Notably, configuration bits may be continuously read out of configuration memory 1112 for error checking subject to error detection as described hereinbelow, where some bits are masked as previously described. Examples of configuration bit frames in an FPGA that may be checked include IOB, BRAM, and global clock configuration frame data, among other frame data.

Configuration data 1111 may be read from configuration memory 1112 via memory interface 1113. Read configuration data is obtained from data bus 1130 coupled between configuration memory 1112 and memory interface 1113. This configuration data 1111 is provided is parallel to memory interface 1113 and ECC checker 1115 of readback circuit 1120. ECC checker 1115 obtains portions of a frame of configuration data 1111 and registers the data for processing. Notably, output of ECC checker 1115 is not asserted, as it is not valid, until all bits of a frame have been processed, such that a final syndrome value may be generated.

Parity bits 1110 should make syndrome value output 1124 from ECC checker 1115 equal to zero provided no error exists in the frame of data read. In this context of no detected error, syndrome valid signal 1125 is true, e.g., a logic 1, indicating that a syndrome calculation is complete, and error signal 1126 would be false, e.g., a logic 0. If, however, syndrome value output 1124 is non-zero, namely, at least one bit error is detected, then syndrome valid signal 1125 is true once a syndrome calculation is complete, and error signal 1126 in this example will be true, e.g., logic 1.

After a frame of data has been read and processed by ECC checker 115, outputs 1124, 1125 and 1126 from ECC checker 1115 are provided to SEU detector 1116. SEU detector 1116 is configured to assert a frame data signal 1131, which is provided to ICAP controller ("ICAP") 1117 in this embodiment, responsive to syndrome valid signal 1125 being true indicating that a syndrome calculation has been completed. Accordingly, responsive to frame data signal 1131 being asserted, a next portion of a frame of configuration data 1111 may be accessed via ICAP 1117 instruction via read frame signaling 1127. Notably, if frame data signal 1131 is not asserted, reading back of configuration memory will cease. Read frame signaling 1127 is provided to configuration logic which in turn is provided to configuration memory 1112 for reading a more of the same frame of configuration data or a part of a next frame of configuration data. Accordingly, an internal on-chip readback loop may be used for continuous readback.

More particularly, data read from configuration memory 1112 is provided from memory interface 1113 to ICAP 1117 via ICAP bus 1123. This allows data to be progressively collected by ICAP 1117 to track progress in reading a frame. For example, to get the next part of a column of configuration data, ICAP 1117 needs to know the address of where the readback has progressed. In other words, ICAP 1117 needs to know where to start reading again. Accordingly, ICAP 1117 writes an address in address registers and writes an associated read request to the frame data register output to initiate getting more frame data.

If, however, error signal 1126 is true after an entire frame of data has been processed, then next frame signal 1131 may not be asserted and syndrome value output 1124 and error signal 1126 may be provided as user output. For example, if the SDE bit is a logic 0, then a double bit error has been detected. A double bit error may be corrected by at least partial reconfiguration of the PLD.

However, if for example the SDE bit is a logic 1, then there is a single bit error. Accordingly, the remaining bits, for example, 11 remaining bits indicate the location in configuration memory 1112 of the bit to be flipped in a readback frame of configuration data 1111. Thus, single bit errors may be corrected by writing over a memory cell the opposite value currently stored. Notably, if an error is detected, outputs 1124 and 1126 from SEU detector 1116 may be provided externally to FPGA 10 or 60 for a user to initiate reconfiguration of FPGA 10 or 60.

ECC checker 1115 and SEU detector 1116 may both be instantiated in configurable logic. Alternatively, ECC checker 1115 may be hardwired and SEU detector 1116 may be instantiated in configurable logic. Rather than an internal readback loop, an external readback loop may be used. For example, JTAG bus 1122 or select map bus 1121 may be externally accessible pins of FPGA 10 or 60 for external access to configuration memory 1112. A controller or microprocessor external to FPGA 10, 60 may be used to select a next portion of configuration data. Additionally, SEU detector 1116 may be external to FPGA 10 or 60 in such an embodiment.

Additionally, it should be understood that configuration data may be checked by error checker 1115 prior to a readback operation. For example, if bus 1130 is coupled to configuration interface 14 of FIG. 11A, then configuration data may be checked prior to be written to configuration memory 1112.

Figure 12B:
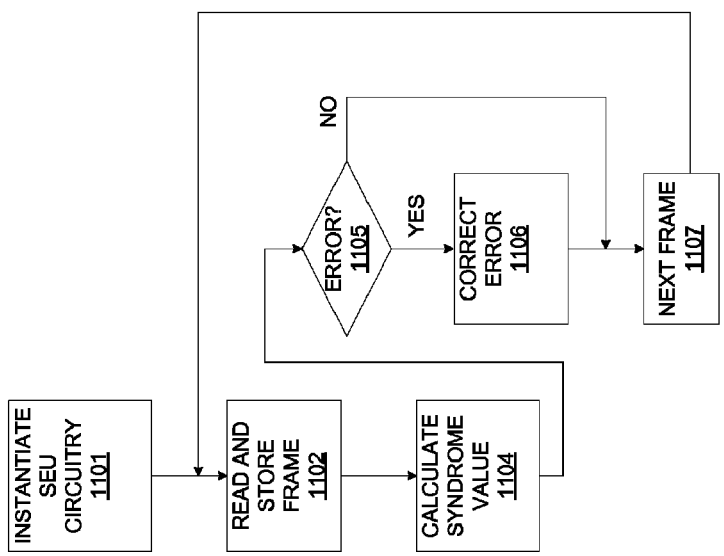
FIG. 12B is a flow diagram depicting an exemplary embodiment of an error checking flow.

FIG. 12B is a flow diagram depicting an exemplary embodiment of an error checking flow 1100. With continuing reference to FIG. 12B and renewed reference to FIG. 12A, error checking flow 1100 is further described. For purposes of clarity by way of example, it will be assumed that an FPGA internal error checking flow 1100 is used, though an FPGA/external circuitry error checking flow may be used.

At 1101, an SEU detector core is instantiated in configurable logic of FPGA 10 or 60. It will be assumed that ECC checker 1115 is hardwired, and that ICAP 1117 has already been instantiated in configurable logic.

At 1102, a frame of configuration data is read from configuration memory 1112 via memory interface 1113 under control of ICAP 1117. The frame of configuration data read may be temporarily stored, such as in BRAM or CLB flip-flops of the FPGA. The read frame includes ECC bits. At 1104, a syndrome value is calculated from the frame of data, including ECC bits and configuration data, read at 1102.

At 1105, the syndrome value calculated at 1104 is checked to determine if an error was detected. If no error was detected, a next frame is accessed at 1107. If an error is detected at 1105, then the entire frame may be re-written at 1106 for both single and multiple bit errors. Alternatively, if a single-bit error is detected at 1105, then the incorrect bit may be inverted and written back at 1106 on a frame or sub-frame basis. This write back may be done by a user.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, rather than combinatorial logic to compute syndromes, a processor may be used; rather than using flip-flops to store partial syndromes, registers, memory or other data storage devices may be used. Claim(s) listing steps do not imply any order of the steps. Trademarks are the property of their respective owners.

What is claimed is:

1. An integrated circuit device having programmable resources and configuration memory, comprising:
    a memory interface coupled to the configuration memory;
    an error checker coupled to the configuration memory, the error checker coupled to receive configuration information read from the configuration memory via the memory interface, the configuration information including error correction bits, wherein the error correction bits comprise a single error correction-double error detection code, the error checker configured to determine partial syndrome values from subframes of the configuration information read;
    an error detector coupled to the error checker to receive the syndrome value determined and to provide an error signal to indicate whether an error was detected; and
    a controller coupled to the memory interface to control reading out of the configuration information from the configuration memory, the controller coupled to the error detector to receive the error signal.

2. The integrated circuit device, according to claim 1, wherein the error checker is formed of hardwired logic.

3. The integrated circuit device, according to claim 1, wherein the error detector is instantiated in configurable logic.

4. The integrated circuit device, according to claim 1, wherein the error checker is instantiated in configurable logic.

5. The integrated circuit device, according to claim 1, wherein the controller is an internal configuration access port controller.

6. A integrated circuit device, comprising:
    a configuration interface;
    an error checker coupled to the configuration interface, the error checker coupled to receive configuration information provided via the configuration interface, the configuration information including error correction bits, wherein the error correction bits comprise a single error correction-double error detection code, the error checker configured to determine partial syndrome values from subframes of the configuration information read; and
    an error detector coupled to the error checker to receive the syndrome value determined and to provide an error signal to indicate whether an error was detected.

7. A method for decoding encoded information, the encoded information including data bits and parity bits, the method comprising:
    obtaining a portion of the encoded information;
    relocating at least one parity bit of the parity bits within the portion of the encoded information; and computing a partial syndrome value for the portion of the encoded information with the at least one parity bit relocated.

8. The method, according to claim 7, further comprising:

identifying location of the portion of the encoded information relative to other portions of the encoded information;

determining whether the partial syndrome value is an initial partial syndrome value or other partial syndrome value responsive to the location;

storing the partial syndrome value as a syndrome value responsive to the partial syndrome value being an initial partial syndrome value; and combining the partial syndrome value with the syndrome value previously stored responsive to the partial syndrome value not being an initial partial syndrome value for storage as the syndrome value anew.

9. The method, according to claim 8, further comprising:

determining whether the location is a last word of the encoded information;

setting a flag responsive to whether the location is the last word; and determining whether the syndrome indicates an error responsive to the location being the last word.

10. An integrated circuit comprising:

programmable resources and programmable interconnections;

a bitstream comprising a plurality of sets of bits, a set of bits of the plurality of sets of bits having a data portion and an error correction code portion, wherein the error correction code portion comprises a single error correction-double error detection code, the bitstream for programming the programmable resources and programmable interconnections; and configuration memory cells configured to store the plurality of sets of bits.

11. The integrated circuit of claim 10 comprising a field programmable gate array (FPGA).

12. The integrated circuit of claim 10 wherein the set of bits comprises a frame.

13. The integrated circuit of claim 12 wherein the frame is of fixed length.

14. The integrated circuit of claim 13 wherein the fixed length is 1312 bits.

15. The integrated circuit of claim 10 wherein error correction code portion comprises parity bits.

16. The integrated circuit of claim 10 further comprising error correction code logic for correcting at least one bit in the data portion of the set of bits using error correction code portion.

17. The integrated circuit of claim 16 wherein error correction code logic comprises dedicated circuitry.

18. An integrated circuit comprising:

programmable resources and programmable interconnections;

a bitstream comprising a plurality of sets of bits, a set of bits of the plurality of sets of bits having a data portion and an error correction code portion, wherein the error correction code portion comprises a single error correction-double error detection code, the bitstream for programming the programmable resources and programmable interconnections;

configuration memory cells configured to store the plurality of sets of bits; and error correction code hardwired logic for correcting at least one bit in the data portion of the set of bits using the error correction code portion.

\* \* \* \* \*